(12) United States Patent
Cohen et al.

(10) Patent No.: US 6,713,827 B2
(45) Date of Patent: Mar. 30, 2004

(54) MICRO-STRUCTURES AND METHODS FOR THEIR MANUFACTURE

(75) Inventors: Guy Moshe Cohen, Mohegan Lake, NY (US); Steven Alan Cordes, Yorktown Heights, NY (US); Joanna Rosner, Cortlandt Manor, NY (US); Jeannine Madelyn Trewhella, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/351,919

(22) Filed: Jan. 27, 2003

(65) Prior Publication Data

US 2003/0148548 A1 Aug. 7, 2003

Related U.S. Application Data

(62) Division of application No. 10/072,330, filed on Feb. 7, 2002, now Pat. No. 6,562,642.

(51) Int. Cl.[7] .................. H01L 27/14; H01L 29/82; H01L 29/84
(52) U.S. Cl. .................. 257/414; 257/347; 438/48; 438/22
(58) Field of Search ................ 257/414, 347, 257/431; 438/48, 22

(56) References Cited

U.S. PATENT DOCUMENTS 6,051,866 A * 4/2000 Shaw et al. .................. 257/417
6,252,725 B1 * 6/2001 Tran et al. .................. 359/811

* cited by examiner

Primary Examiner—David Nelms
Assistant Examiner—Tu-Tu Ho
(74) Attorney, Agent, or Firm—Thu Ann Dang; Ryan, Mason & Lewis, LLP

(57) ABSTRACT

A method is provided for the manufacture of micro-structures, such as micro-electromechanical structures (MEMS) or silicon optical benches (SiOB). The method includes using a single mask to pattern two or more cavity areas to be etched into a substrate in different etching steps, and then selectively choosing the cavity areas for etching. In a preferred embodiment, the method includes patterning a substrate to identify a plurality of cavity areas to be etched into the substrate and filling at least one of the cavity areas with a distinctive filler material. Filler material is chemically distinctive in the sense that it can be etched selectively with respect to the other filling materials. At least one of the cavity areas containing a distinctive filler material is then chosen based at least in part on the distinctive filler material. The chosen cavity area is then etched. The methods of the invention produce micro-structures with more accurate cavity areas by minimizing overlay error and avoiding the need for lithography over extreme topography. The micro-structures manufactured by the methods of the invention are also provided herein.

9 Claims, 28 Drawing Sheets

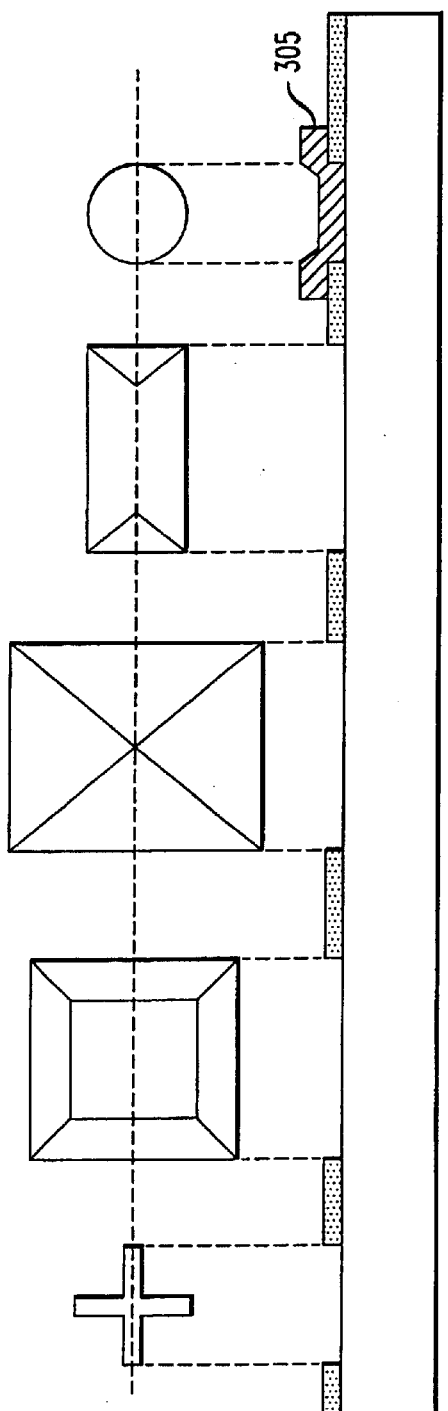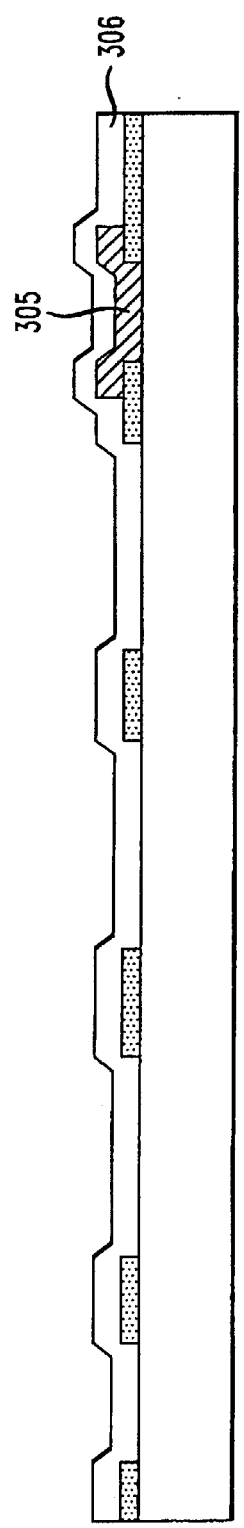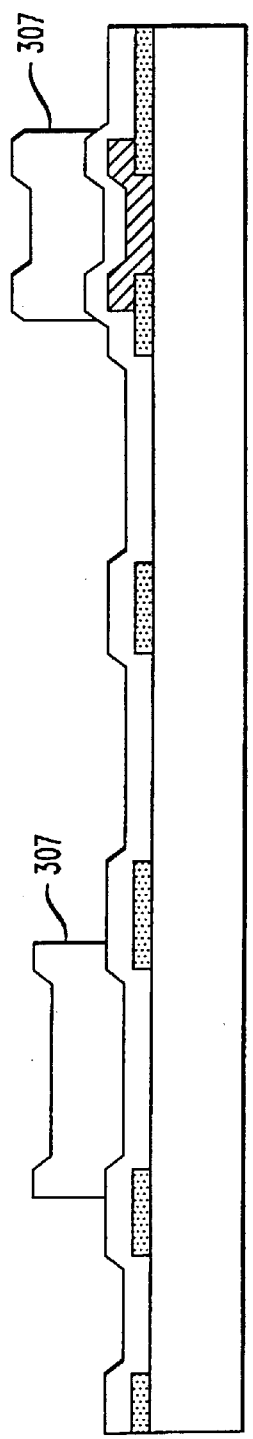
FIG. 12

MICRO-STRUCTURES AND METHODS FOR THEIR MANUFACTURE

CROSS REFERENCE TO RELATED APPLICATION

This application is a divisional of U.S. application Ser. No. 10/072,330, filed Feb. 7, 2002, now U.S. Pat. No. 6,562,642, the disclosure of which is incorporated by reference herein.

FIELD OF THE INVENTION

The present invention relates to the manufacture of micro-structures and, more specifically, to the manufacture of micro-structures using a method that provides accurate patterning and reduced overlay error, as well as accurate lithography over extreme topography.

BACKGROUND OF THE INVENTION

The manufacture of micro-structures, such as micro-electromechanical structures (MEMS) or optical devices, such as transmitters/receivers, require precise placement of components. In the case of an optical device, for example, these components typically include a laser diode, a monitor photodiode, lenses, mirrors, isolators and optical fibers. Accurate positioning of the components can be achieved by the use of another micro-structure, called an optical bench. An optical bench consists of etched cavities, sockets, grooves, etc. into which the optical components are placed. The cavities accommodate the components and provide accurate positioning of the parts in all three axes.

Conventionally, cavity areas to be etched are first patterned individually by lithography. Lithography includes the use of photographic techniques to register particular cavity areas on a substrate, such as silicon. Generally, light is emitted through a mask to outline a pattern of a cavity area onto a film residing on a substrate, such as a silicon substrate. In this manner, the pattern of the cavity areas to be etched is transferred onto the film to create a hard mask on the substrate.

Different physical characteristics of the cavities to be etched typically require different fabrication techniques. This usually means that each of the cavities are processed separately, using successive lithography steps.

For example, cavity areas that are required to have vertical side walls are typically etched by reactive ion etching (RIE), while cavities with sloped side walls may be achieved by anisotropic wet etching. In addition, all of the cavities are usually not of the same depth, and thus cannot be etched in a single etch step. Also, the opening of the cavity (x,y dimension) affects the etch rate and thus the depth of the cavity (z dimension). This effect is particularly noticeable for dry etching. Since not all cavities have the same opening but may require the same depth, their etching is carried out in separate steps.

The use of multiple lithographic steps can create difficulties. For example, each lithography step can introduce an overlay error due to misalignment of the mask with respect to previous masks. A misaligned cavity would cause an optical component to be positioned off the optical axis. The main cause for misalignment is the overlay error associated with multiple lithographic steps.

Also, after the etching of the first set of cavities, the bench surface is no longer planar and would typically exhibit extreme topography. The extreme topography causes difficulty in obtaining uniform photoresist coverage in subsequent mask exposures. Moreover, the depth of focus will vary due to the topography, and thus the obtained resolution will degrade.

Accordingly, a need exists for an improved method of manufacture of micro-structures that avoids the pitfalls of conventional methods, including overlay error and the need for accurate lithography over extreme topography.

SUMMARY OF THE INVENTION

The present invention provides methods for manufacture of micro-structures, such as MEMS or silicon optical benches. In one aspect of the invention, the method includes using a single mask to pattern two or more cavity areas to be etched into a substrate in different etching steps, and then selectively choosing the cavity areas for etching.

In a preferred embodiment, the method includes patterning a substrate to identify a plurality of cavity areas to be etched into the substrate and filling at least one of the cavity areas with a distinctive filler material. Filler material is chemically distinctive in the sense that it can be etched selectively with respect to the other filling materials. At least one of the cavity areas containing a distinctive filler material is then chosen based at least in part on the distinctive filler material. The chosen cavity area is then etched.

In a preferred embodiment, filling a cavity area with a distinctive filler material includes: (a) filling a plurality of cavity areas with a first filler material; (b) protecting at least the cavity areas containing first filler material with a protective material, leaving first filler material of at least one cavity area unprotected; (c) removing said unprotected first filler material to form an exposed cavity area; (d) removing the protective material; and (e) adding a distinctive filler material to said exposed cavity area.

In another preferred embodiment, two different distinctive filler materials are applied to the cavity areas in an alternating sequence. It is preferred that the cavities be filled with the filler materials in a sequence that is opposite the sequence in which the cavities are to be etched. In this way, the cavity areas can be selectively etched without affecting other cavity areas to be etched separately. It is preferred that the method further include: (a) filling with a first filler material said plurality of cavity areas to be etched in an etching sequence; (b) protecting with a protecting material at least one unprotected cavity area and any previously protected cavity areas, said protecting performed in a sequence opposite the etching sequence; (c) removing the first filler material from remaining unprotected cavity areas; (d) removing said protecting material deposited in step (b); (e) filling with a second filler material said plurality of cavity areas to be etched in an etching sequence; (f) protecting with a protecting material at least one unprotected cavity area and any previously protected cavity areas, said protecting performed in a sequence opposite the etching sequence; (g) removing the second filler material from remaining unprotected cavity areas; (h) removing said protecting material deposited in step (f); and (i) repeating steps (a) through (h) for all but the first cavity area to be etched in the etching sequence, such that the substrate within said first cavity area to be etched is exposed by removing said first filler material in step (c) or removing said second filler material in step (g).

The methods of the invention minimize overlay error and circumvent the need for accurate lithography over extreme topography. The methods provided herein also allow for accurate dimensional control in the presence of such extreme topography. Precision lithography is not required after the initial mask, which provides exact registry of all the cavities with respect to each other. All lithographic steps are carried out on flat surfaces. Additionally, the method of the invention permits the incorporation of metal traces and metal patterns on top of a surface having non-planar portions.

In another aspect of the invention, novel micro-structures are provided. As mentioned above, the micro-structures provided by the process of the invention have more accurately defined cavity areas as compared to micro-structures manufactured by conventional means. The increased accuracy is achieved, at least in part, by avoiding overlay error and the need for accurate lithography over extreme topography. The micro-structures are formed in accordance with a process as outlined above, and described further herein.

BRIEF DESCRIPTION OF THE DRAWINGS

The foregoing and other objects, aspects and advantages will be better understood from the following detailed description of preferred embodiments of the invention, with reference to the drawings.

FIGS. 12(a)–(c) illustrates the removal of the first filler material, removal of the photoresist, addition of a second filler material, and addition of a photoresist over cavity areas c5 and c2.

DETAILED DESCRIPTION OF PREFERRED EMBODIMENTS

The present invention is illustrated in conjunction with an exemplary method of manufacturing a silicon optical bench. It is to be appreciated, however, that the techniques described herein may be applied generally to the manufacture of a wide variety of micro-structures having various applications. Such applications include, for example, electronic, mechanical, optical, or biological applications. In general, the method of the invention can be applied to the manufacture of any micro-structure that includes small cavities closely aligned in relation to each other and formed into a substrate, such as silicon.

As discussed above, the technique of etching grooves into a silicon substrate is often used to facilitate the precise placement of components. Generally, the cavities utilized for the placement of components in such a structure range in size from approximately 1 to several hundred microns. However, the length of an etched cavity, for example, a v-groove for holding an optical fiber, can be millimeters in length. Sub-micron precision is often required for placement of such components in order to create a structure with the desired characteristics. The invention, however, is not limited to any particular cavity size.

Figure 1:
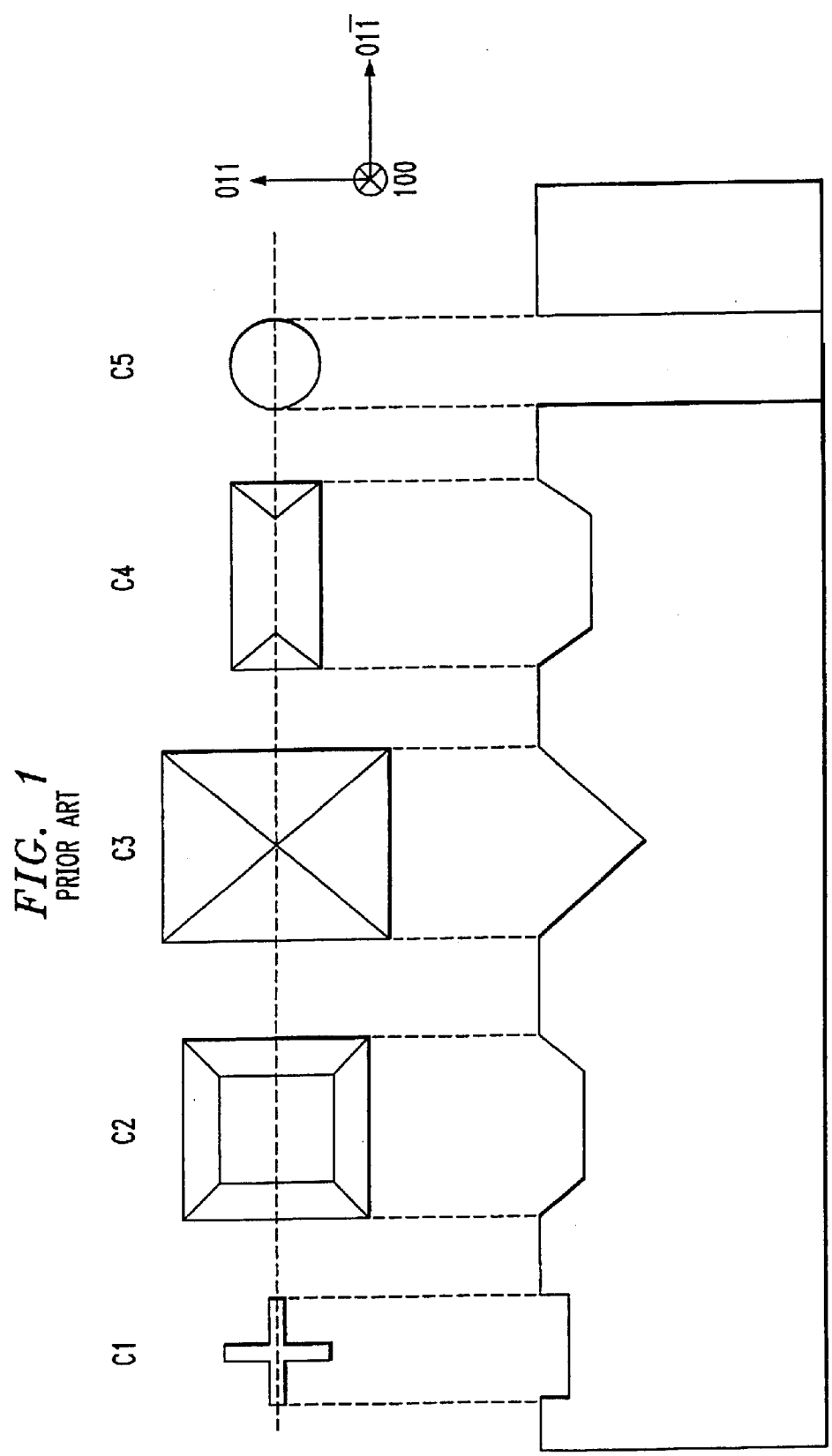
FIG. 1 illustrates a conventional silicon bench, having five different types of cavities etched into it.

FIG. 1 shows a top view and a cross section of a v-groove c4, a shallow trench c1, a socket c3, a cavity having a flat bottom c2, and a via c5, i.e., a hole etched from one side of a wafer to the other side, all which are commonly built into a silicon substrate during the conventional manufacturing of an optical bench. Since the cavities are different in dimension and in their physical characteristics, the process for making such a bench would typically require five different masks.

The number of masks can be reduced to four since the etch of cavities c3 and c4 is self-terminating. Cavities c3 and c4 are self-terminating since these cavities are defined solely by a set of <111> planes. Since many anisotropic wet etchants have a negligible etch rate for the <111> planes, it is possible to etch certain cavities of different size with a single etch step. Once the cavity c4 <111> planes are exposed, the etch process practically stops in that cavity. Meanwhile, the etch will continue in the larger cavity, c3, and will stop once its <111> planes are fully exposed.

By exploiting the self-terminating etch property of anisotropic etchants, one can save etching steps and reduce the number of lithographic steps. Yet, as shown in FIG. 1, the cavity c2 includes a <100> plane, and thus is not self-terminating. Moreover, the etching of cavity c5 requires the use of an etching technique such as reactive ion etching (RIE), where directionality in the etch can be obtained. Therefore, the cavities shown in FIG. 1 illustrate why, in the conventional method of fabrication, several lithography and etching steps are required.

The method of the invention is illustrated in FIGS. 2(a)–27(c), referring to the same type of cavities in FIG. 1 to illustrate the novelty of the invention as compared to the conventional method. As discussed above, the method of the invention minimizes the overlay error associated with multi-step lithography and avoids performing lithography (or pattern transfer) over extreme topography.

Generally, the method includes patterning a substrate to identify a plurality of cavity areas to be etched, filling at least one cavity area with a distinctive filler material to form a filler plug, selectively choosing at least one cavity area to be etched based at least in part on said distinctive filler material, and etching the chosen cavity area. Distinctive filler material means any filler material that allows one to selectively choose to etch a particular cavity area as opposed to other identified cavity areas.

Figure 2:
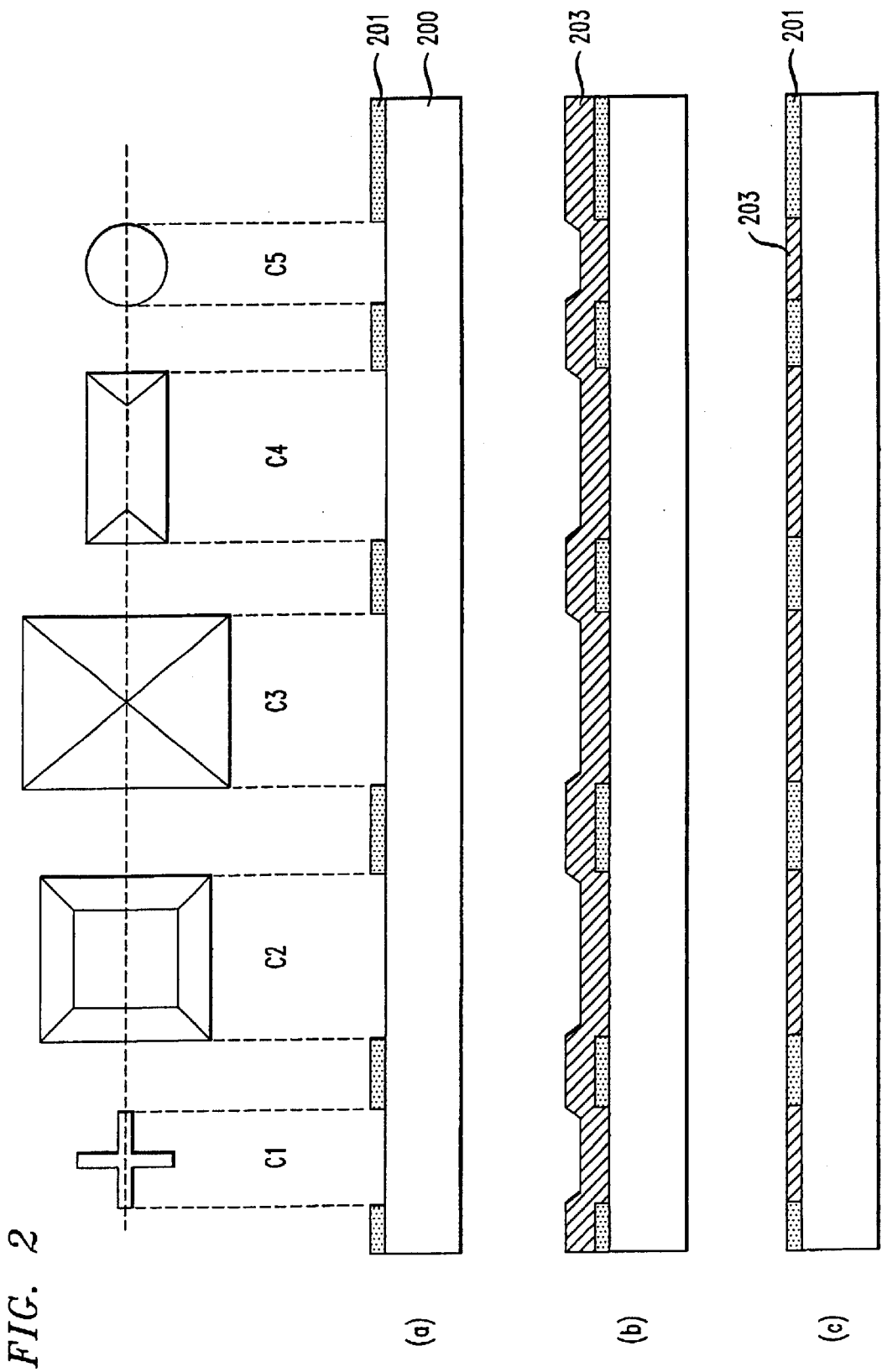
FIGS. 2(a)–(c) illustrates patterning of a substrate, deposition of a first filler layer, and planarization of the first filler layer as part of a method in accordance with the present invention.
Figure 3:
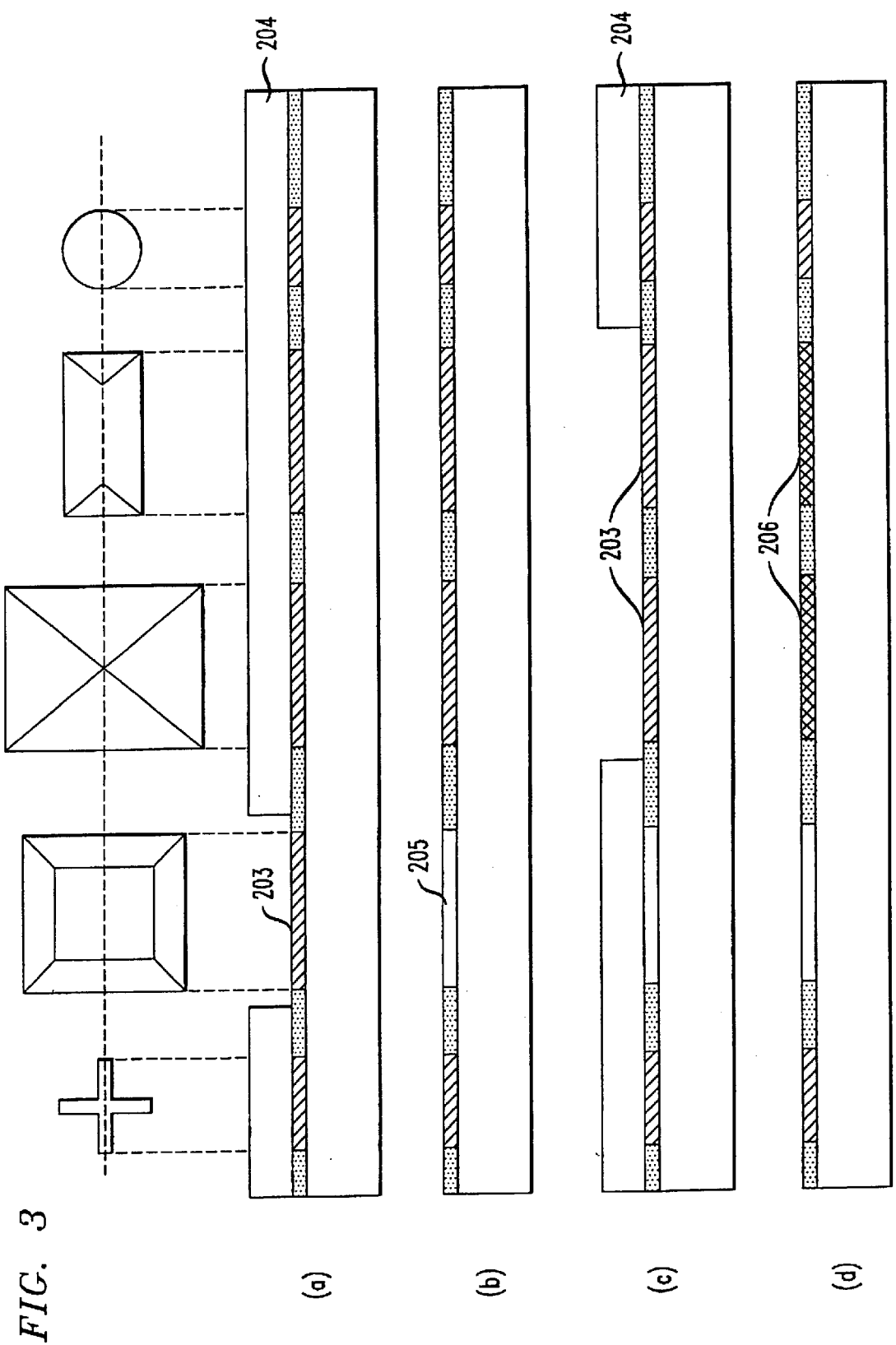
FIGS. 3(a)–(d) illustrates depositing distinctive filler layers in accordance with the present invention.
Figure 4:
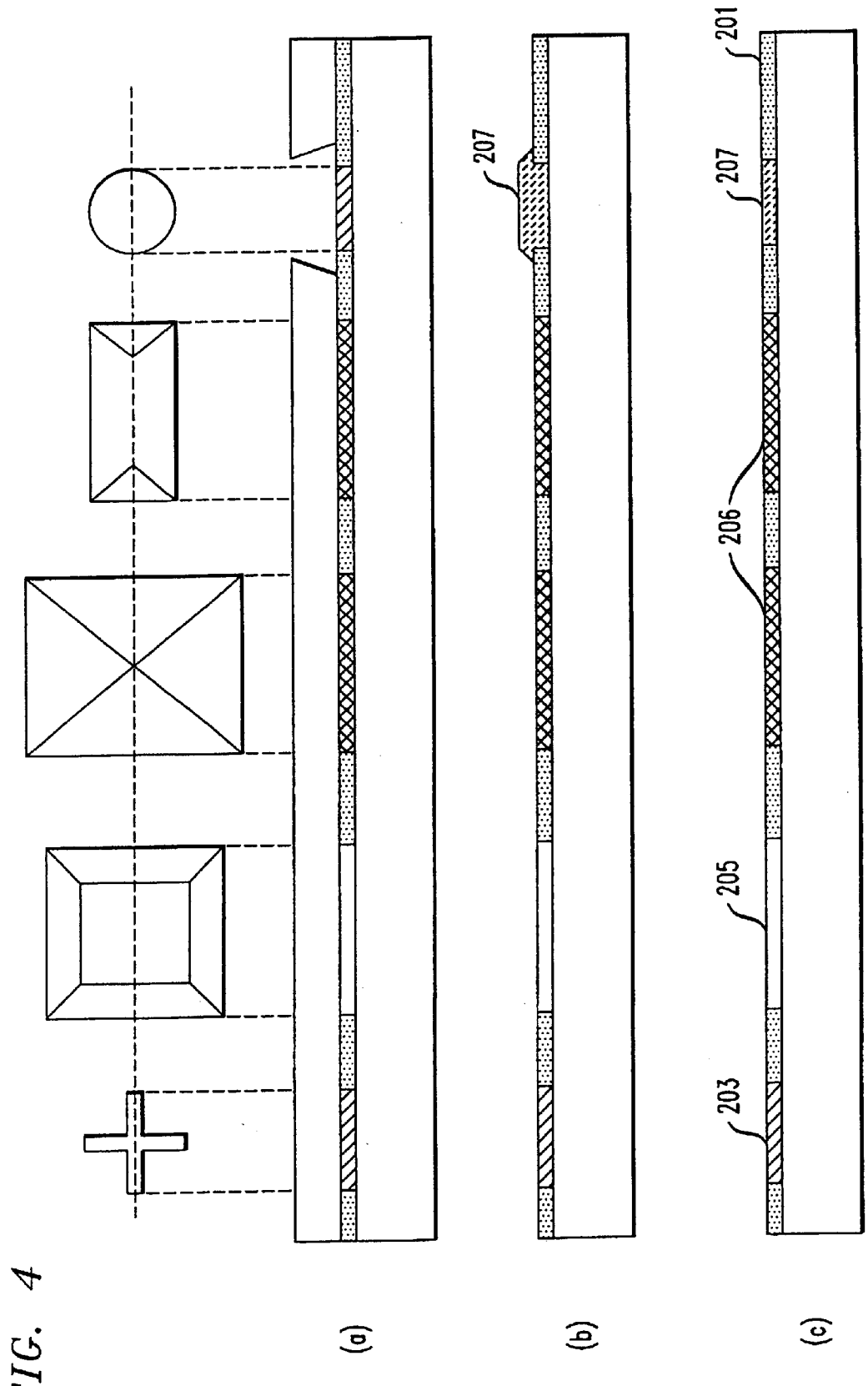
FIGS. 4(a)–(c) illustrates depositing filler material using a lift-off process in accordance with the present invention.
Figure 5:
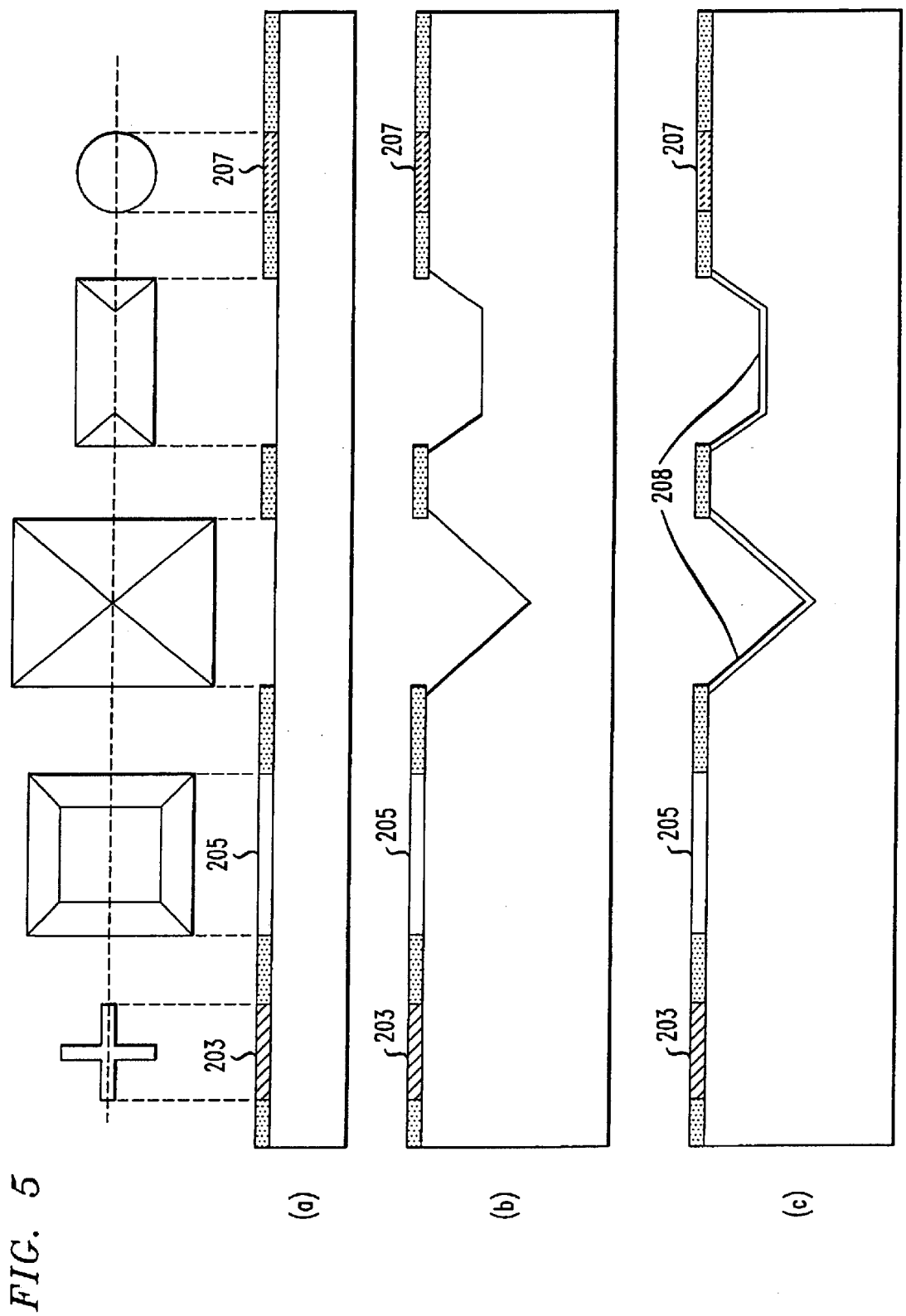
FIGS. 5(a)–(c) illustrates selective simultaneous etching of cavities c3 and c4 and passivation of the etched cavities in accordance with the present invention.

FIGS. 2(a)–7(c) describe a first preferred embodiment of the invention. In FIG. 2(a) a thin film 201 is deposited over a substrate 200. The substrate 200 can be any substrate suitable for the manufacture of micro-structures, for example, a silicon wafer. The thin film 201 can be any film suitable for patterning micro-structures, for example, silicon nitride ($Si_3N_4$). The thin film 201 is patterned using conventional means, for example, lithography and reactive ion etching (RIE). The openings in the thin film 201 define the cavity areas (c1 to c5) that will be etched into the silicon substrate 200. FIG. 2(a) shows the structure after the patterning of the thin film 201. After patterning, the film 201 is referred to as a hard mask.

In FIG. 2(b) a first filler layer 203 is deposited over the structure. In a preferred embodiment, the structure is planarized by conventional means, e.g., by chemical mechanical polishing (CMP) after deposition of the filler material. Planarization removes any filler material 203 deposited over the hard mask 201 top surface, and leaves filler material 203 in the cavity areas defined by the hard mask 201. The planarized structure is shown in FIG. 2(c). However, as discussed below with regard to FIGS. 8(a)–10, planarization is not always necessary.

In FIG. 3(a), the surface of the structure is covered with a protective material 204. Such protective materials are known in the art. One example of such a protective material is a photoresist, which is referred to in the examples and figures herein.

The photoresist 204 is patterned to expose the area defined by cavity area c2. The filler material 203 is removed from cavity area c2 by conventional means, for example, by an etching process, and the photoresist 204 is stripped. The lithography for removing the filler material 203 does not require accurate alignment, since the c2 opening was pre-registered into the hard mask 201 using the zero level mask. It is sufficient if the lithography exposes the c2 area and keeps the other cavities, i.e., c1 and c3–c5 covered.

In FIG. 3(b), a second filler material 205 is deposited over the surface, and the structure is planarized. The planing process removes the filler material 205 above the hard mask 201 line, leaving a plug of filler material 205 that is disctinct for cavity area c2. The planarized structure following the second planarization step is shown in FIG. 3(b).

In a preferred embodiment, the process of removing the first filler 203 and replacing it with a different filler is repeated for each of the cavities to be etched in a separate cavity etching step, less one. As explained above, cavities c3 and c4 can be etched in a single etch step since their etching is self-terminating. As shown in FIG. 3(c), following the coating of the surface with photoresist 204, cavities c3 and c4 are exposed. The filler material 203 is removed and replaced by a distinct filler material 206 in cavity areas c3 and c4, as shown in FIG. 3(d).

Filler materials can include any filler material suitable for the manufacture of micro-structures. For example, filler material can include an oxide, such as aluminum oxide, hafnium oxide, zirconium oxide, or yttrium oxide. The oxide can also include a doped oxide, such as borosilicate glass or phosphosilicate glass. Other filler materials include doped p-type silicon or doped p-type polysilicon. Semiconducting material can also be used as a filler material. Examples of semiconducting materials include GaAs, InP, InGaAs, GaN, AlN, AlGaAs, InAlAs, GaP, InGaP, InAs and InSb.

FIGS. 4(a) and 4(b) illustrate filling material 207 being deposited using a lift-off process. In the lift-off process, the filler material does not cover the entire surface of the structure, but forms a mushroom like structure shown in FIG. 4(b). Planing such structures is much more efficient than the removal of a continuous film. However, as known in the art, some deposition techniques of filler materials are not compatible with a lift-off process.

The process described above of removing the first filler material and replacing it with a distinctive filler material is repeated N−1 times, with N equal to the number of cavities to be etched in a separate etching step. Another way of calculating N is simply the number of separate etching steps necessary to etch the desired cavities in the various cavity areas. FIG. 4(c) shows a structure having openings corresponding to cavity areas c1 to c5 filled with distinct filler materials. The filler materials, including the first filler material, within each of the cavity areas are distinct in that each of the filler materials can be used to select a particular cavity area to be etched. Cavity areas c3 and c4 have the same filler material since they are to be etched during the same etching step. More specifically, cavity area c1 is filled with filler 203, cavity area c2 is filled with filler 205, cavity areas c3 and c4, which are to be etched concurrently, are both filled with filler 206 and cavity area c5 is filled with filler 207.

The next step is etching the cavities. By etching step is meant the step wherein a groove or cut is made into the substrate material. Selecting a cavity area to be etched is achieved by selectively removing the filler material out of the opening in the hard mask 201 that defines that cavity area. Thus, lithography in the presence of a non-planar surface is circumvented.

FIGS. 5(a)–(c) illustrates the simultaneous etching of cavities c3 and c4. As shown in FIG. 5(a), the filler material 206 has been selectively removed from the opening. Following selective removal of the filler material 206, the cavities are etched by conventional means. For example, an anisotropic etchant such as KOH can be used to etch cavities c3 and c4 as shown in FIG. 5(b).

In a preferred embodiment, when the etching is completed, the cavities are fixed by passivation. Passivation prevents these cavities from etching further during the etching of other cavities. Passivation can be achieved by known means, such as oxidation of the etched surface 208. Passivation of cavities c3 and c4 is illustrated in FIG. 5(c). An alternative passivation method is incorporation of p-type dopants, such as boron or indium, into the surface 208. The dopant is incorporated, for example, by an ion implant or gaseous phase diffusion. Gaseous phase diffusion has the advantage of being able to passivate vertical walls and negative slope walls.

Figure 6:
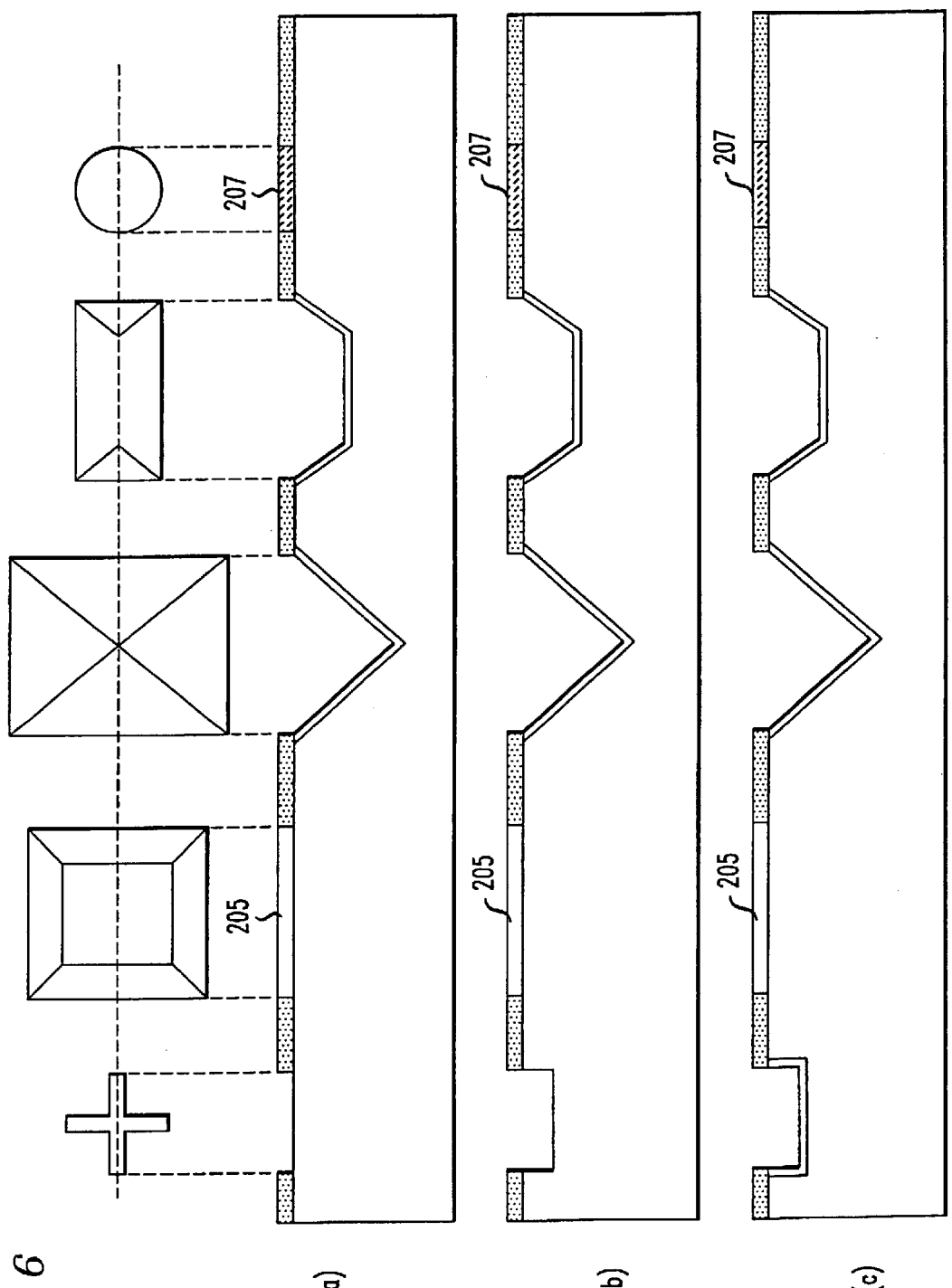
FIGS. 6(a)–(c) illustrates the selective etching of cavity c1 in accordance with the present invention.
Figure 7:
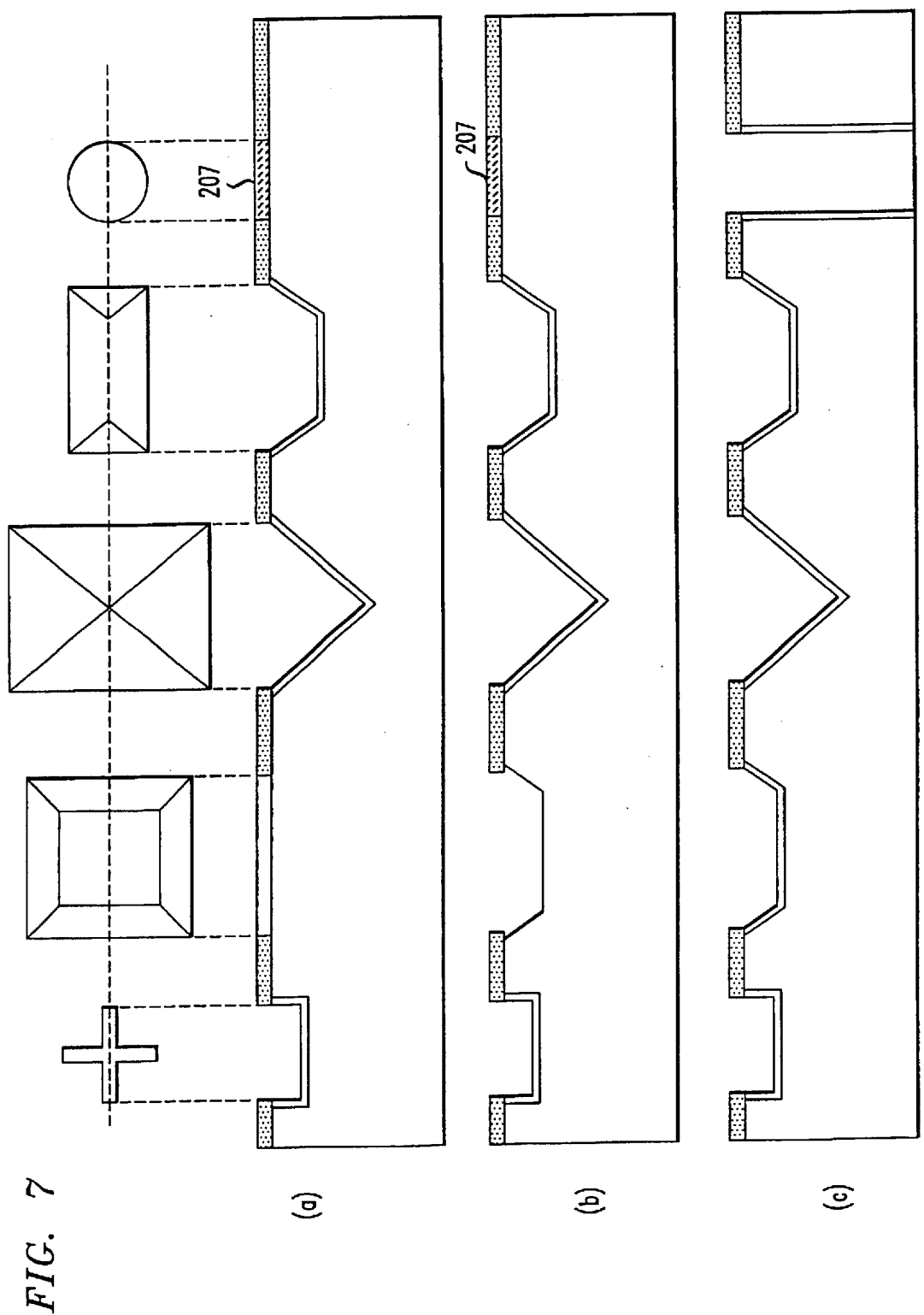
FIGS. 7(a)–(c) illustrates the selective etching of cavities c2 and c5 in accordance with the present invention.
Figure 8:
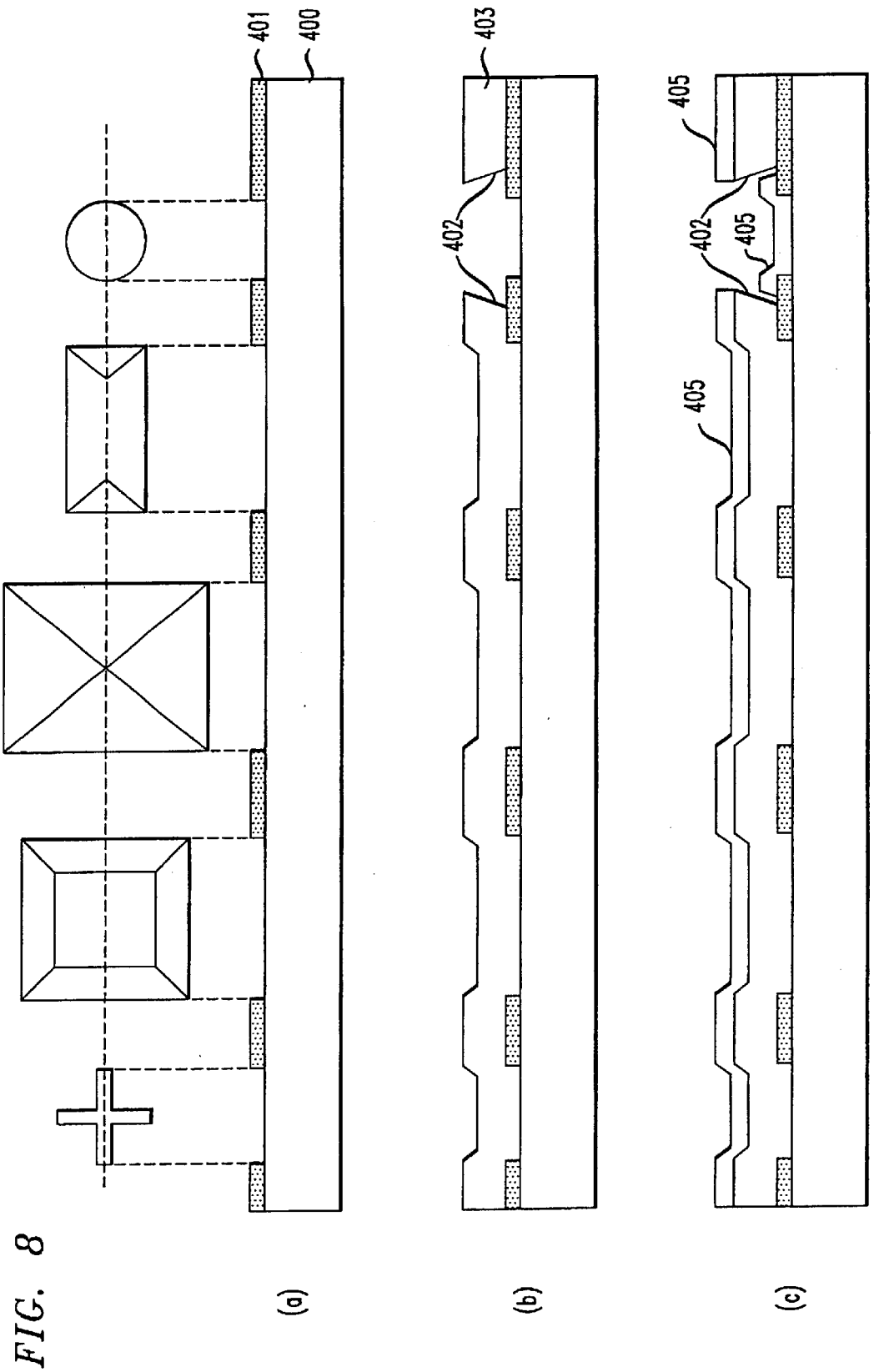
FIGS. 8(a)–(c) illustrates a method of the invention utilizing a lift-off process for depositing filler material, but without planarization.
Figure 9:
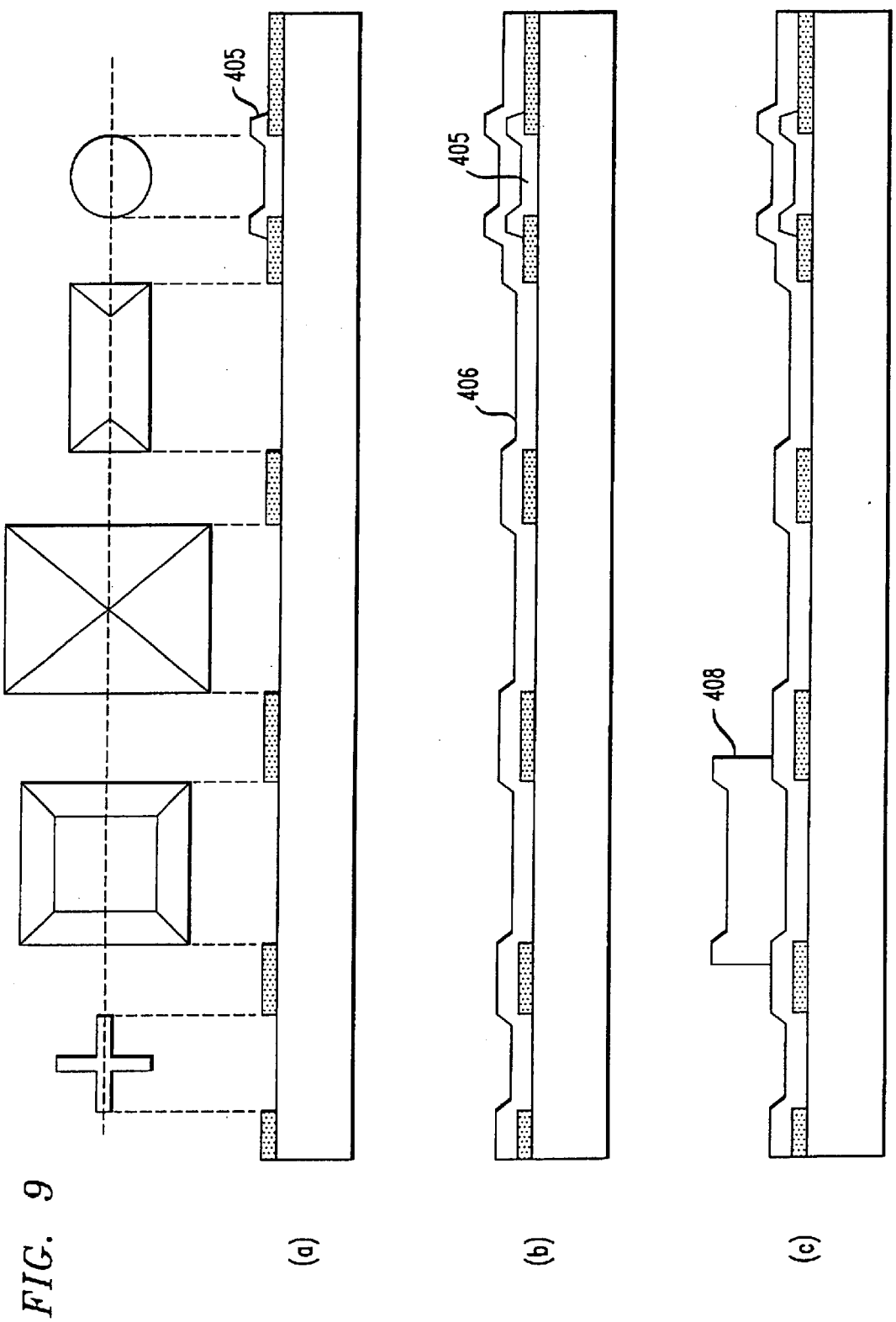
FIGS. 9(a)–(c) illustrates a method of the invention using masking and etching to deposit the filler materials, but without planarization.

Etching of each cavity starts by removing the filler material within the cavity area. FIGS. 6 and 7 illustrate the procedure outlined above for the etching of the cavities c1, c2 and c5. The etching of cavity c2 is similar to that of cavities c3 and c4. The etching of cavities c1 and c5, requires a directional etching technique such as RIE. The passivation of cavities by oxidation works well for RIE etching of silicon. For example, HBr based recipes for silicon etching exhibit a selectivity of over 100:1 with respect to oxide.

FIG. 6(a) shows the removal of filler material 203 from cavity area c1. FIG. 6(b) shows the etching of cavity c1 and the passivation of the cavity is shown in FIG. 6(c). FIG. 7(a) shows the removal of filler material 205 from cavity area c2. FIG. 7(b) shows the etching of cavity c2 and the passivation of the cavity is shown in FIG. 7(c). FIG. 7(c) also shows the etched c5 cavity.

The method described with regard to FIGS. 2(a)–7(c) include planarization of the structure following each deposition of filler material. These planarization steps can be skipped if the requirement for complete planarization is relaxed, and a small degree of topography due to the filling of the cavity areas is allowed. FIGS. 8(a)–10 show a modification of the preferred embodiment described above that excludes the planarization step following deposition of the filler material.

To keep the topography limited to that caused by the shallow openings in the hard mask, the filler material is patterned so that it is confined to the region of the opening in which it forms a filler plug. The patterning of the filler material into plugs can be achieved by a lift-off process or by protecting the cavity area with a photoresist and removing the deposited filler material from unmasked areas. In either cases a "mushroom-like" plug is left in the cavity area.

FIGS. 8(a) to 8(c) illustrate the process described above when lift-off is used for depositing the filler material and the planarization step is skipped. FIG. 8(a) illustrates the structure with a hard mask 401 on top of a substrate 400 as described above. In FIG. 8(b) a photoresist 403 is applied above all of the cavity areas except the cavity area where the filler material is to be deposited. It is preferred that the photoresist be deposited with a negative slope opening 402, i.e., with the opening being larger at the top of the cavity area than at the bottom adjacent to the hard mask. As shown in FIG. 8(c) by utilizing a negative slope opening 402, the portion of filler material 405 to be inserted in cavity area c5 breaks from the rest of the filler layer that is to be removed.

FIGS. 9(a) to 9(c) illustrate the deposition of filler material 406 by protecting certain cavity areas with a photoresist and deposition/removal of filler material as described above, but without planarization. FIG. 9(a) shows the mushroom cap of the filler material 405 at cavity area c5 from the lift-off procedure described in connection with FIGS. 8(a) to 8(c) after removal of the photoresist 403. The remaining cavity areas have no filler material. In FIG. 9(b) a second filler layer 406 is deposited. In FIG. 9(c) a photoresist 408 is deposited above cavity area c2.

Figure 10:
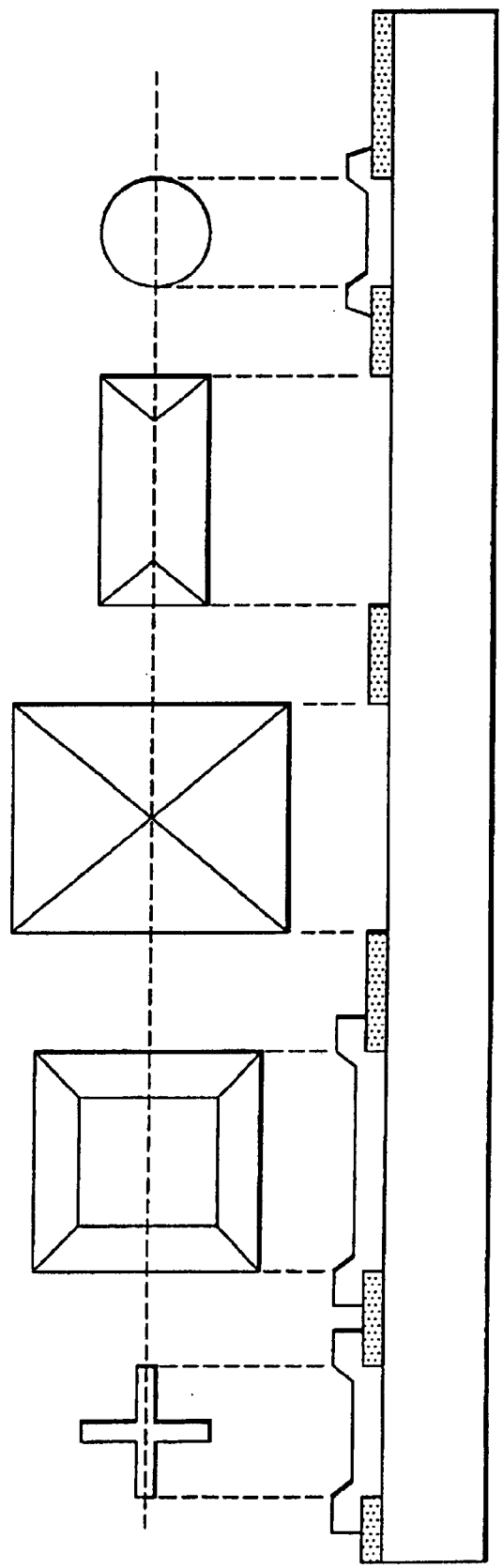
FIG. 10 illustrates filler material deposited in areas c1, c2, and c5 without planarization.
Figure 11:
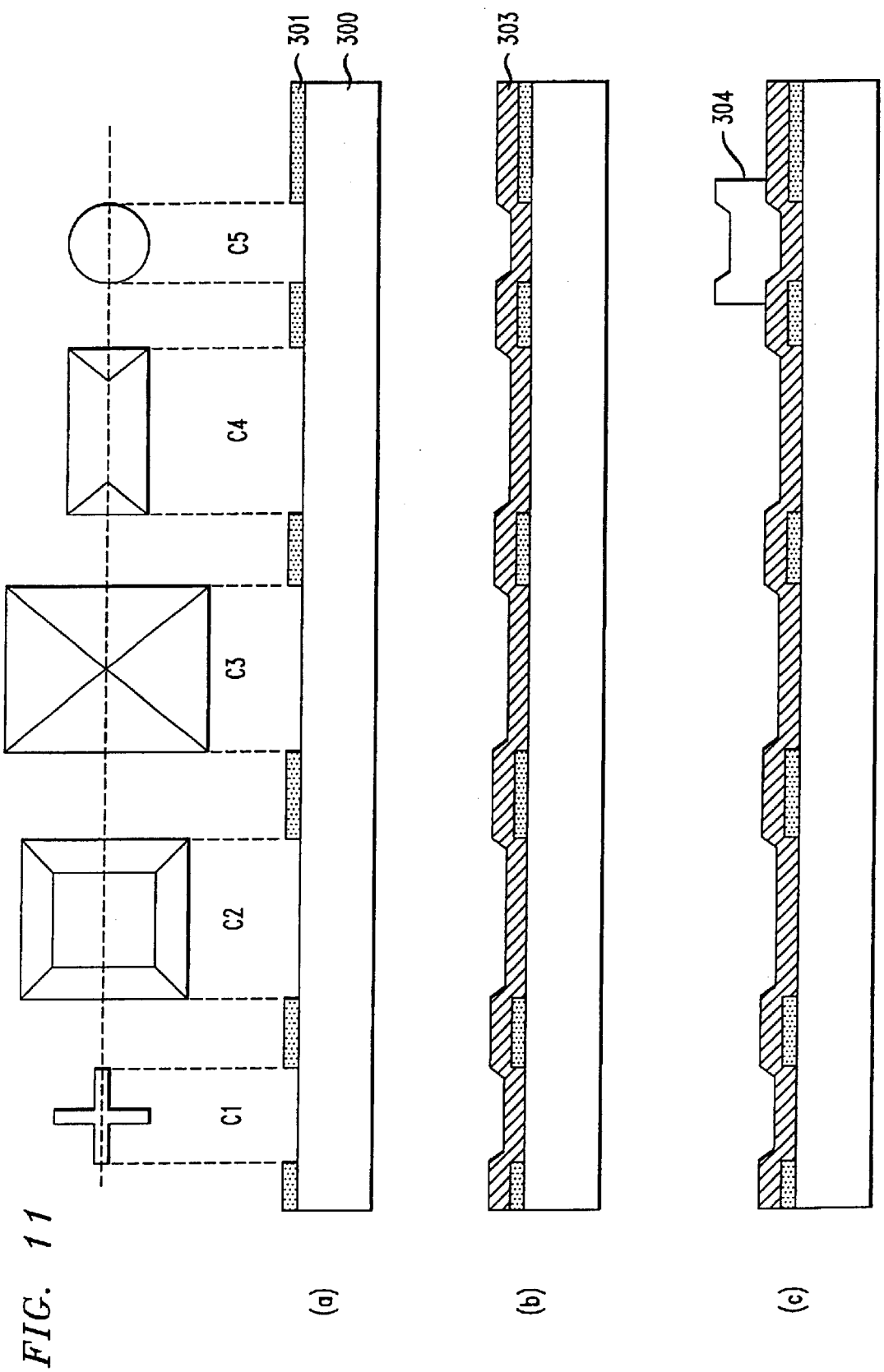
FIGS. 11(a)–(c) illustrates the deposition of a hard mask, deposition of a first filler material, and deposition of a photoresist over cavity area c5 in accordance with the present invention.
Figure 13:
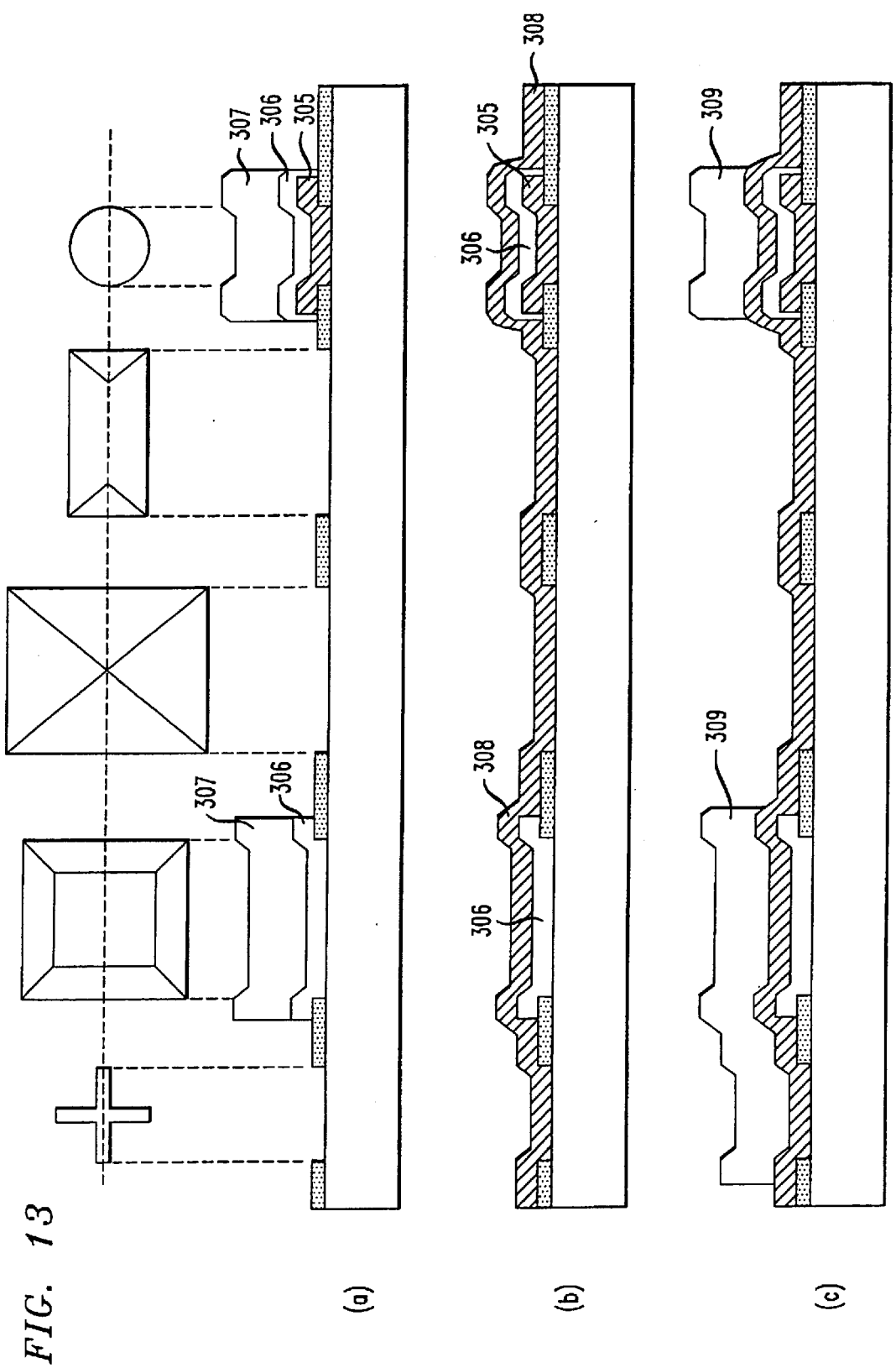
FIGS. 13(a)–(c) illustrates the removal of the second filler material, removal of the photoresist, addition of the first filler material, and addition of a photoresist over cavity areas c5, c2, and c1.
Figure 14:
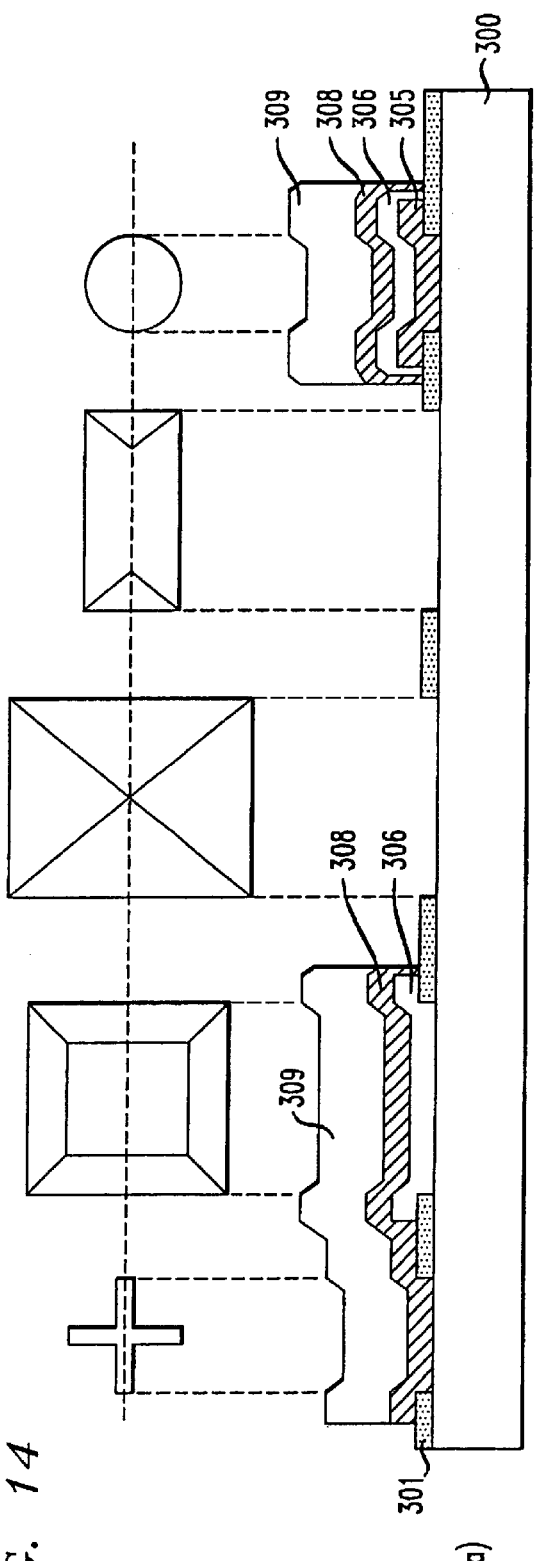
FIGS. 14(a)–(b) illustrates the etching of cavity areas c3 and c4, and passivation of the etched cavities in accordance with the present invention.
Figure 15:
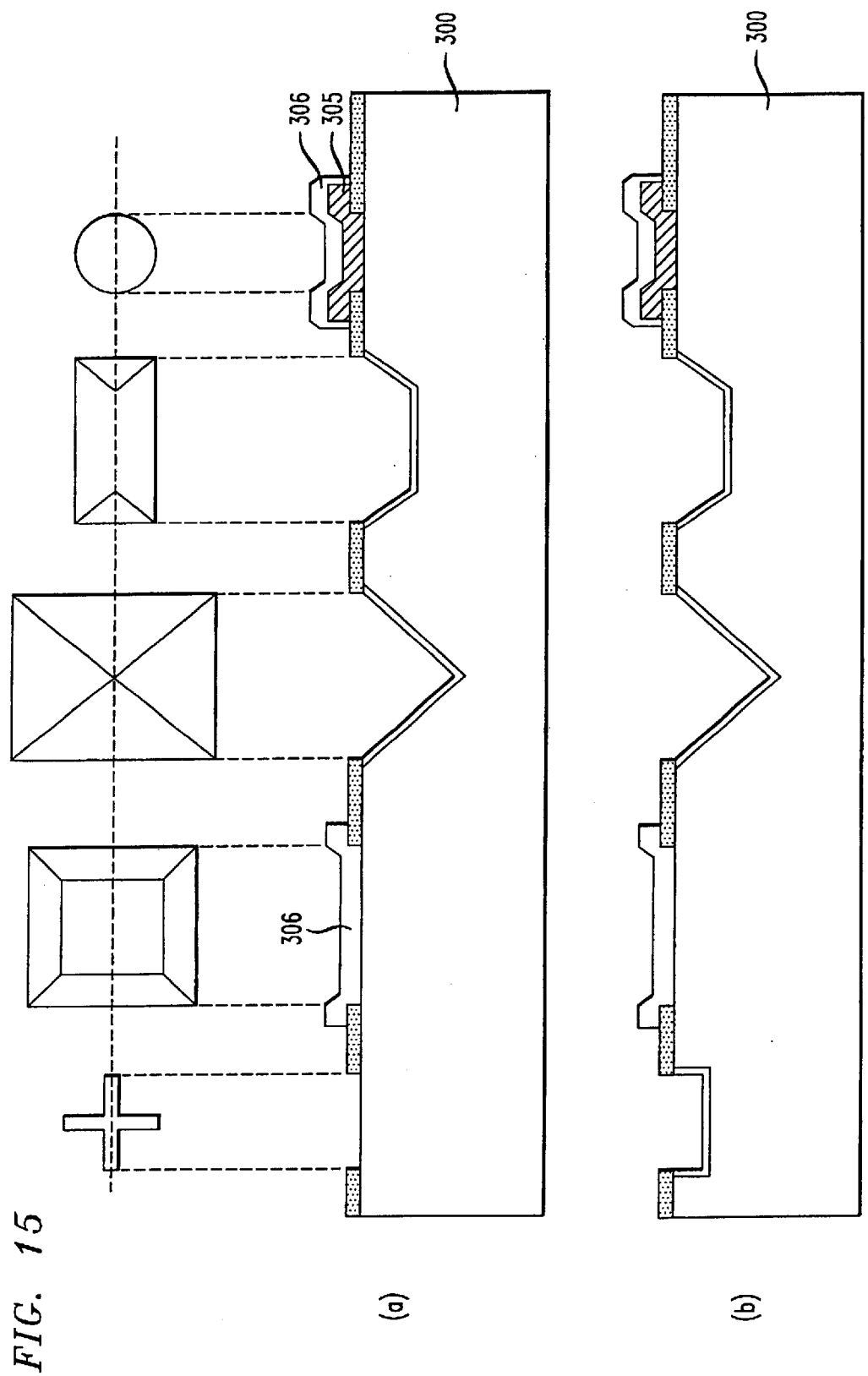
FIGS. 15(a)–(b) illustrates the removal of first filler material, and etching and passivation of cavity c1 in accordance with the present invention.
Figure 16:
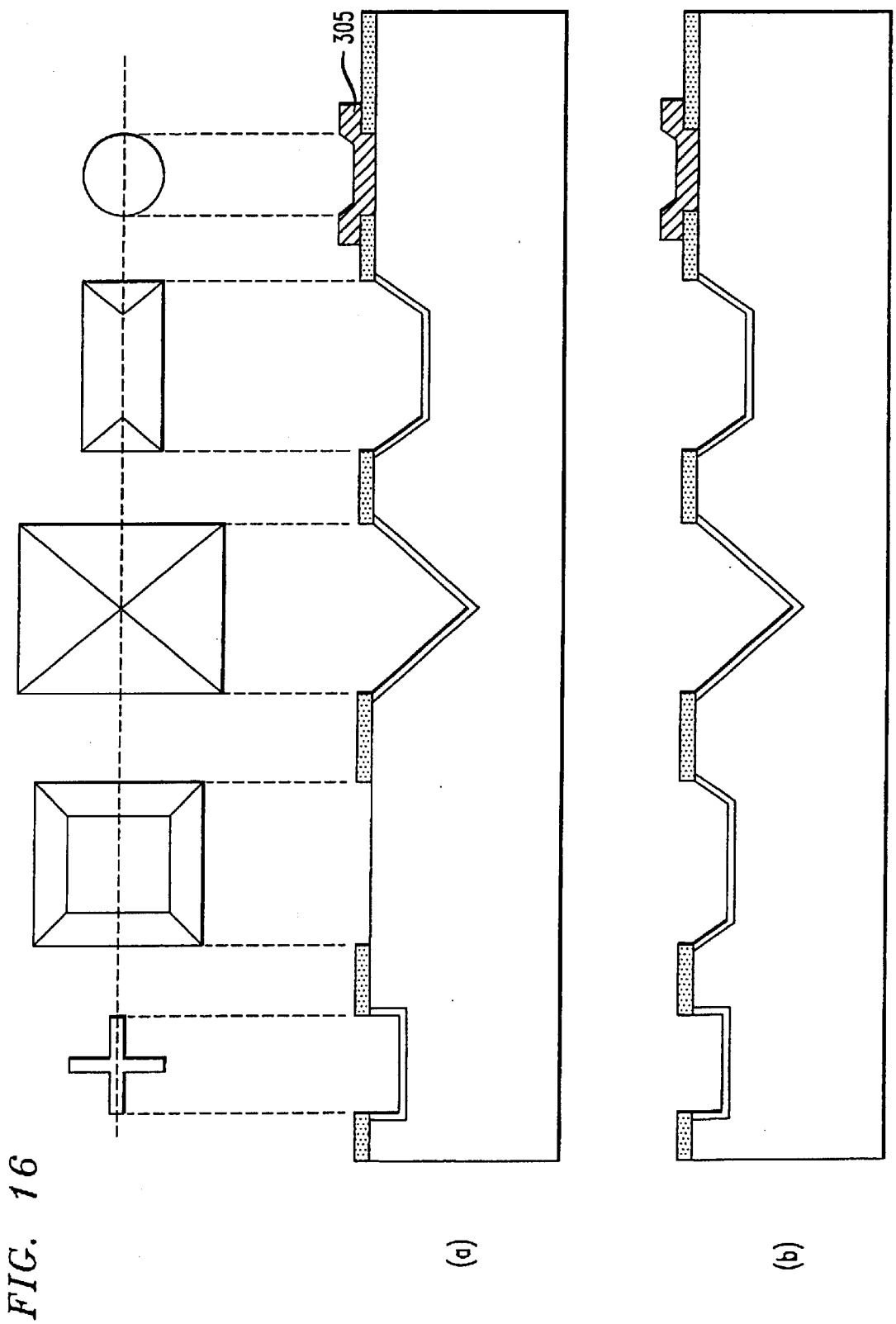
FIGS. 16(a)–(b) illustrates the removal of second filler material, and etching and passivation of cavity c2 in accordance with the present invention.
Figure 17:
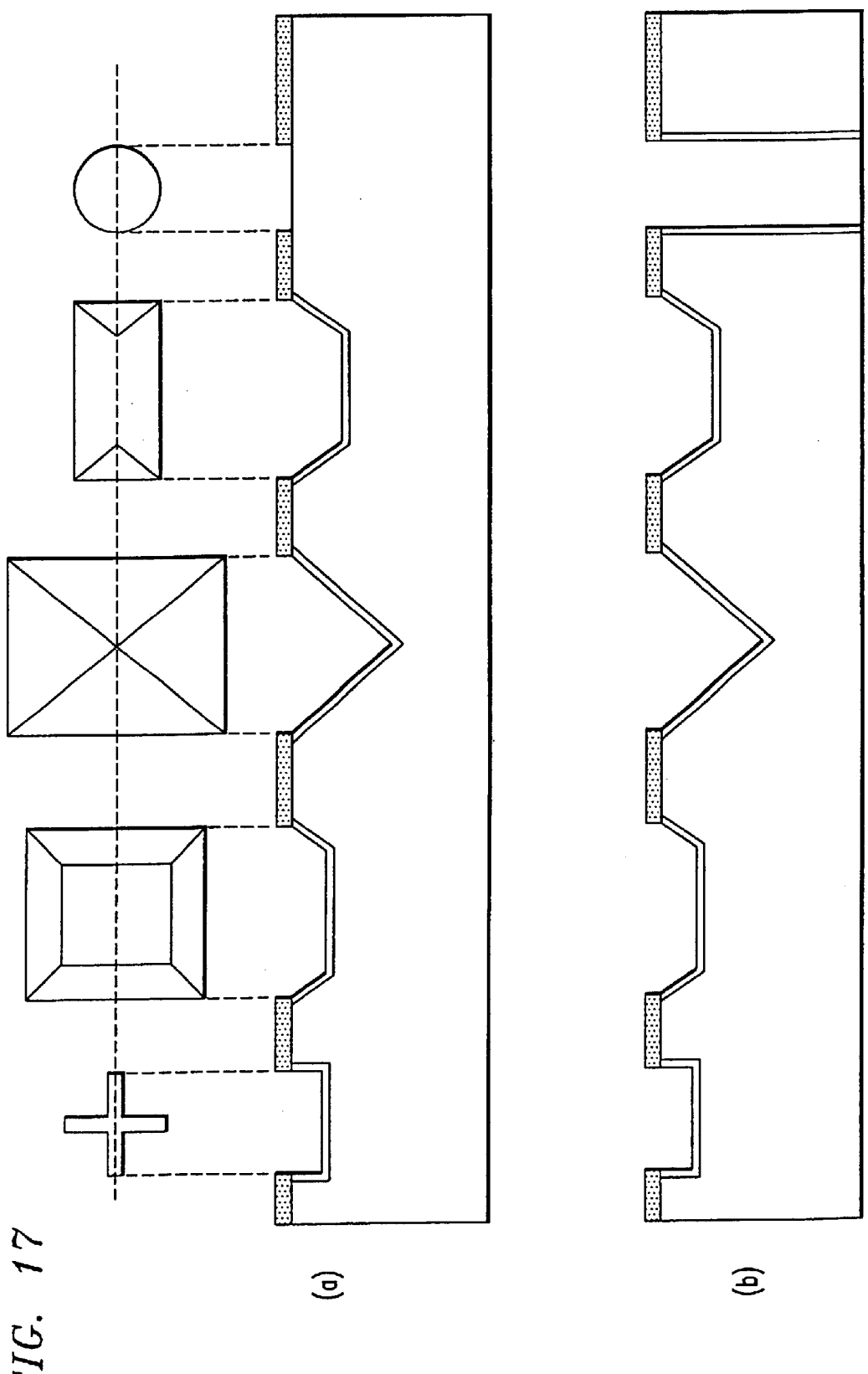
FIGS. 17(a)–(b) illustrates the removal of first filler material, and etching and passivation of cavity c5 in accordance with the present invention.
Figure 18:
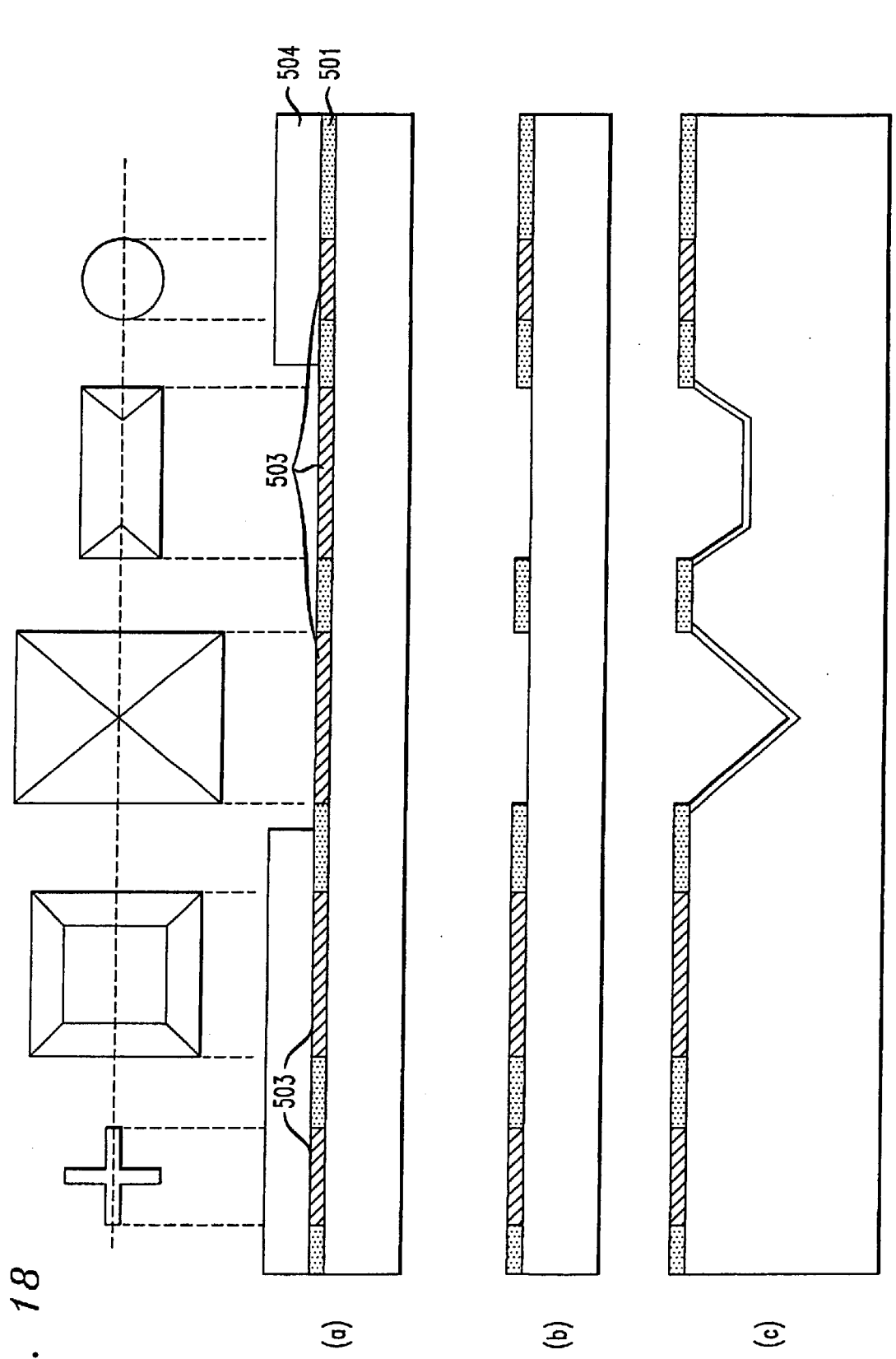
FIGS. 18(a)–(c) illustrates creating a hard mask, depositing filler material that is planarized, depositing photoresist on all but cavities c3 and c4, and etching and passivating cavities c3 and c4 in accordance with the present invention.
Figure 19:
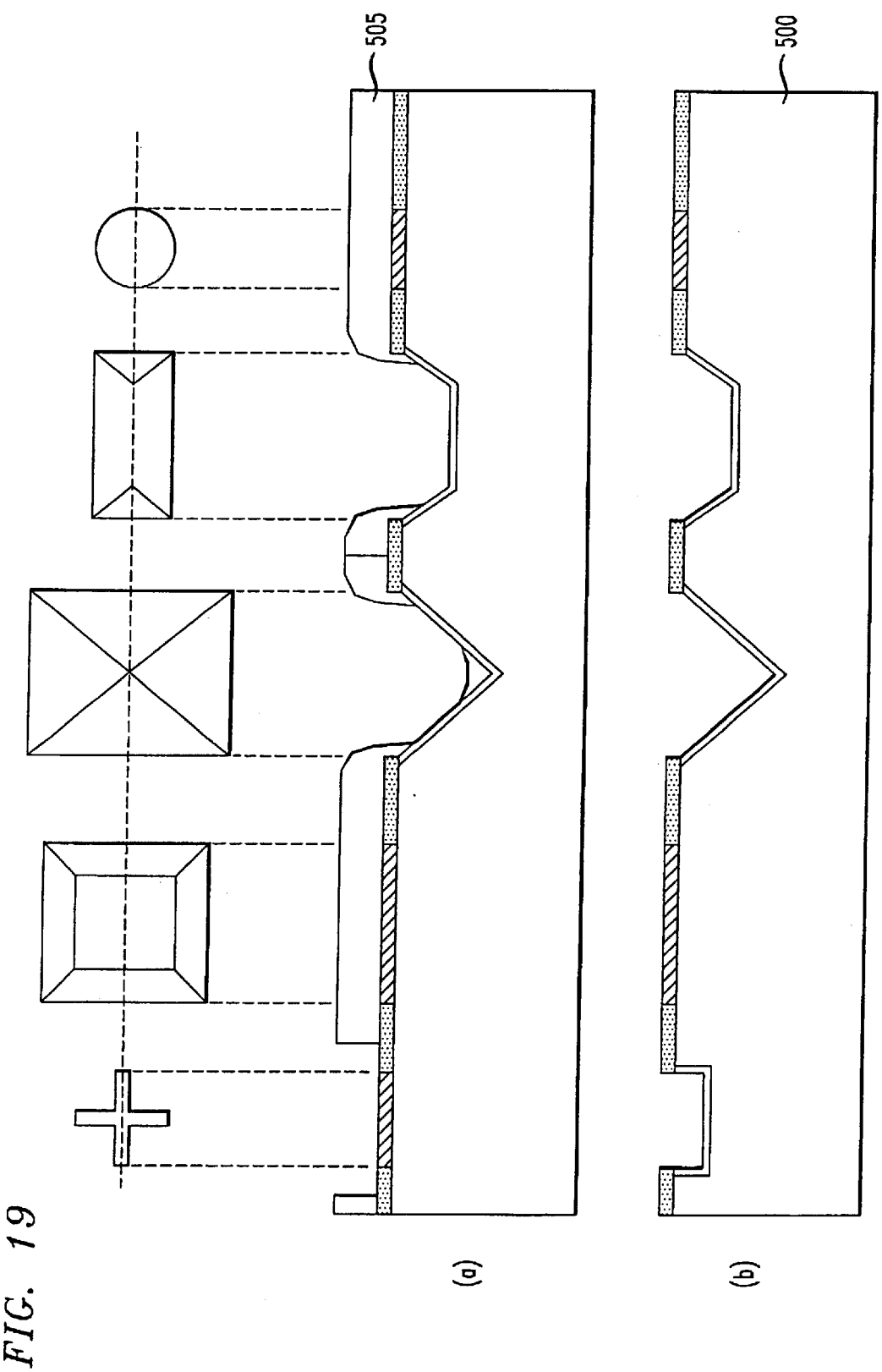
FIGS. 19(a)–(b) illustrates depositing photoresist on all but cavity c1, and etching and passivating cavity c1 in accordance with the present invention.

Once all the plugs are in place as illustrated by FIG. 10, the etching of the cavities can be selectively carried out based upon the distinctive filler materials in the cavity areas without any additional lithography. Cavity areas c3 and c4 do not contain filler material since they are the cavities to be etched first in the etching sequence. FIGS. 11(a)–17(b) illustrate another preferred embodiment of the method of the invention, which requires only two filler materials and is independent of the number of cavities. As will be explained below, by relaxing the requirement of having a fully planarized surface following the filling of each cavity area with a filler material, it is possible to reduce the number different filler materials to two. For the purpose of the example given below, it is assumed that the order by which the cavities are to be etched is: c3 and c4 first, c1 second, c2 third, and c5 last. In general, any other etching sequences can be practiced.

In FIG. 11(a) a thin film layer 301 is deposited over a substrate 300. The thin layer 301 is patterned using a mask which defines all the cavities c1 to c5. The structure, following the patterning of the thin layer 301 which serves as a hard mask, is shown in FIG. 11(a). In FIG. 11(b), a first filler material 303 is deposited over the structure.

The cavity area that is to be etched last, c5, is protected by a protective material, e.g., by photoresist 304 as illustrated in FIG. 11(c). As explained above, photoresist 304 does not require accurate lithography since the definition of the cavity area is registered into the hard mask 301. The photoresist 304 should cover at least the open area in the hard mask 301 which defines the cavity area, and not cover other openings in hard mask 301 which define other cavity areas.

In FIG. 12(a) the first filler material 305 is removed, usually by an etching process, leaving filler material 305 in cavity area c5 that was protected by the photoresist 304. In FIG. 12(b), following stripping of the photoresist 304, a second filler material 306 is deposited over the structure. In FIG. 12(c) cavity area c5 and cavity area c2 are protected by photoresist 307. It is noted that the sequence of depositing the protective material is not arbitrary as in the first embodiment explained in conjucntion with FIGS. 2(a)–7(c). The first cavity to be protected by deposition of the protective material is the last to be etched. In the present example, cavity area c5 is etched last and cavity area c2 is etched in the etching step that precedes that of cavity area c5.

In FIG. 13(a) the second filler material 306 is removed from everywhere but the areas c2 and c5 that were protected by the photoresist 307. In FIG. 13(b) the photoresist 307 is stripped and a layer of first filler material 308 is deposited over the structure. In FIG. 13(c) cavity areas c5, c2 and c1 are protected by photoresist 309. The filler material 308 has been removed from those areas not protected by the photoresist 309 as shown in FIG. 14(a). The photoresist 309 is then stripped.

Cavity etching can then be commenced. No additional lithography is needed beyond this point. Thus, lithography in the presence of extreme topography is avoided. The sequential patterning of the cavities is achieved by selective removal of the filler material in the cavity areas. The number of alternating filler layers in each cavity area determines the order that the cavity areas are opened and etched.

As shown in FIG. 14(a) cavity areas c3 and c4 are to be etched first, and the openings in the hard mask 301 that define cavity areas c3 and c4 expose the substrate 300. Cavity area c1 is to be etched second, and thus contains a filler plug consisting of one filler material layer 308. Filler plug is the filler material within a particular cavity area. Cavity area c2 is to be etched third. Its filler plug consists of two filler material layers 308 and 306. When the filler plug in the c1 cavity area is removed to allow the etching of the cavity area c1, the outer layer 308 of the filler plug in cavity area c2 will also be removed. Yet, the second filler layer 306 will keep c2 from being etched while c1 is etched. The cavity c5 is to be etched last (the 4th etching step). Its plug consists of three filler layers 308, 306 and 305. The outer layer 308 is etched when c1 is opened for etching. The next layer 306 is etched when the cavity c2 is opened for etching. And finally the inner most film 305 is removed when c5 is opened for etching. In FIG. 14(b), the cavity areas c3 and c4 are etched and passivated as discussed previously.

In FIG. 15(a), the filler material 308 has been removed from all cavity areas leaving the substrate 300 in cavity area c1 exposed. Cavity area c1 is etched and passivated as illustrated in FIG. 15(b).

In FIG. 16(a) the filler material 306 is removed from all the cavity areas, leaving the substrate 300 exposed in c2. In FIG. 16(b) the cavity area c2 is etched and passivated. The process is then repeated for the etching of cavity area c5 as shown in FIGS. 17(a) and (b).

Another embodiment of the invention is illustrated in FIGS. 18(a) to 21(b). Unlike conventional methods, the method of the invention minimizes overlay error by registering all of the cavities to be etched using a single mask in one lithography step.

In FIG. 18(a), the cavity areas are filled by depositing filler material 503 in the cavity areas to be etched. In a preferred embodiment, after deposition of the filler material, the structure is planarized by conventional means, for example, CMP, to remove filler material located above the top surface of the hard mask 501. FIG. 18(a) also shows a photoresist 504 is deposited on the structure to protect the filler material in the openings which are not yet to be etched, i.e. cavity areas c1, c2, and c5. The photoresist 504 does not cover the cavity areas to be etched in the next step, i.e., cavities c3 and c4.

In FIG. 18(b) the filler material 503 of the exposed cavity areas, i.e. c3 and c4, is removed by conventional means, e.g., etching. Filler material in the cavities that are protected by the photoresist 504, i.e. cavity areas c1, c2, and c5, remains in those cavities. In FIG. 18(c) the photoresist 504 has been stripped and the cavities c3 and c4 are etched and passivated.

FIG. 19(a) illustrates that after cavities c3 and c4 are etched, the wafer is not planar and exhibits extreme topography. A photoresist film 505 deposited and developed to expose cavity area c1 may not be able to provide complete coverage in the area of the etched cavities c3 and c4 as illustrated in FIG. 19(a). Yet, the rest of the plugs located in the planarized area of the wafer are completely and uniformly covered with the photoresist 505. The photoresist 505 may not provide complete coverage in those cases where filler material within a cavity area is in close proximity to an etched cavity. If complete photoresist coverage is desired, one of the previous embodiments discussed above can be employed in which lithography in the presence of extreme topography is avoided.

Figure 20:
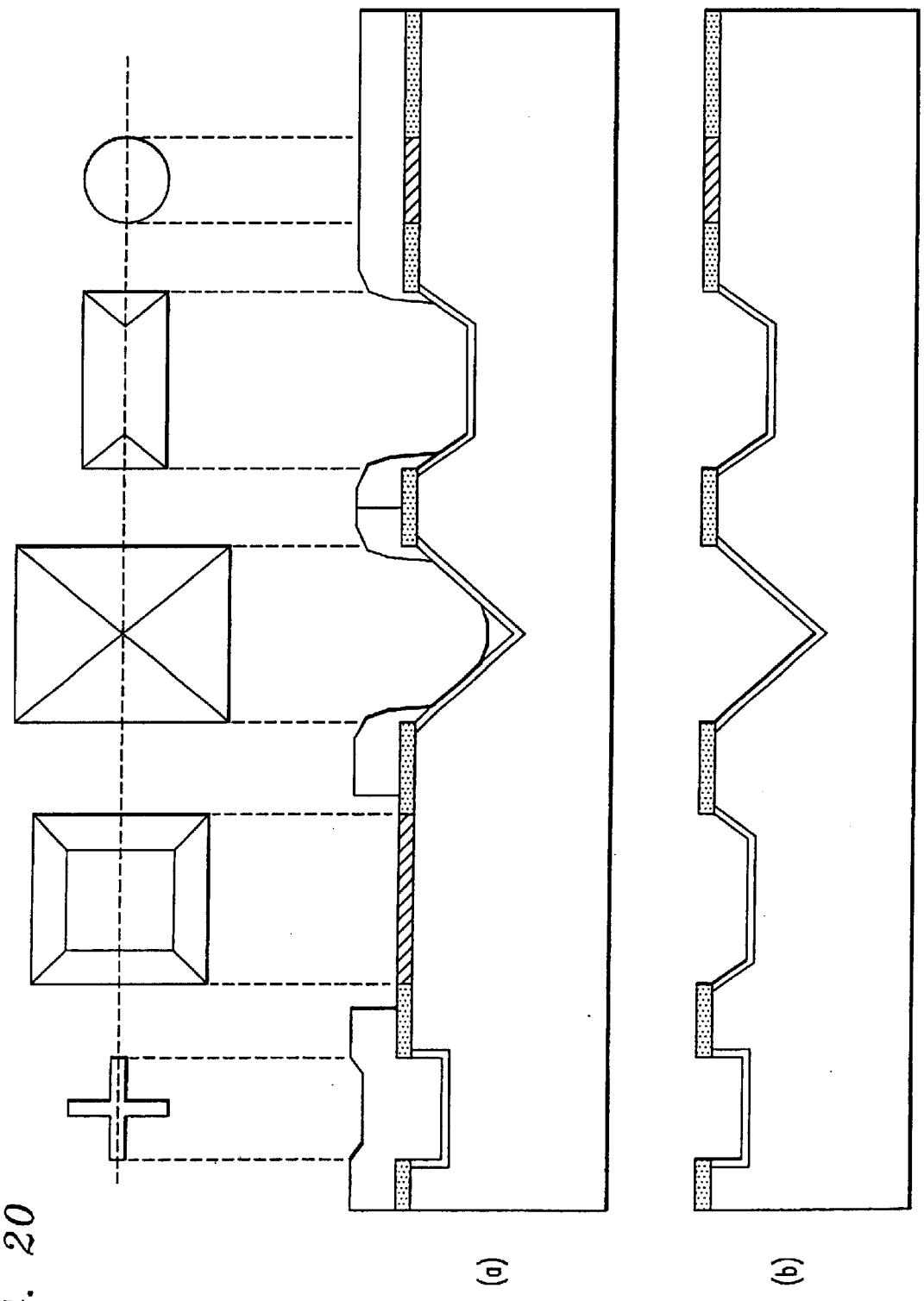
FIGS. 20(a)–(b) illustrates depositing photoresist on all but cavity c2, and etching and passivating cavity c2 in accordance with the present invention.
Figure 21:
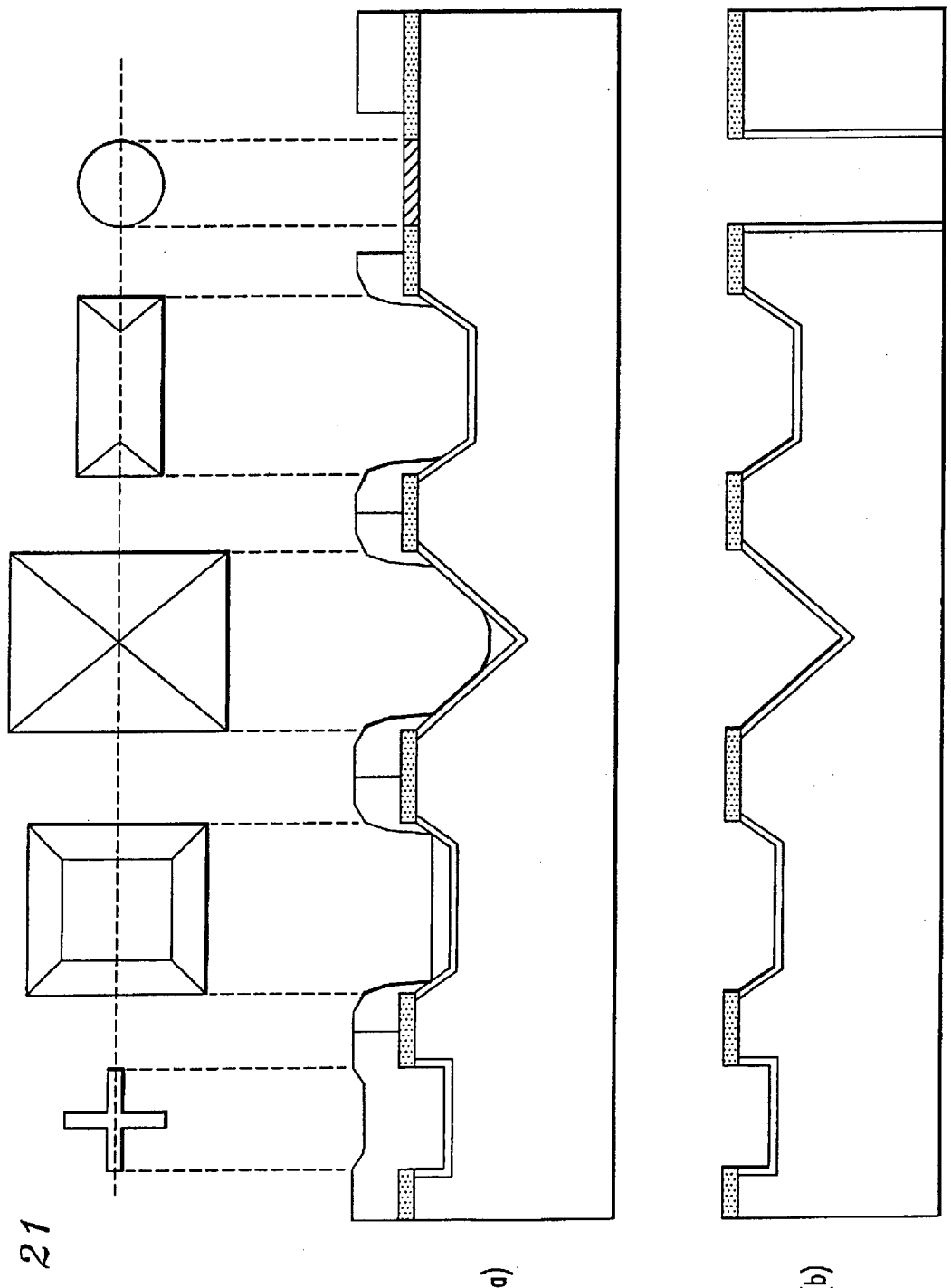
FIGS. 21(a)–(b) illustrates depositing photoresist on all but cavity c5, and etching and passivating cavity c5 in accordance with the present invention.
Figure 22:
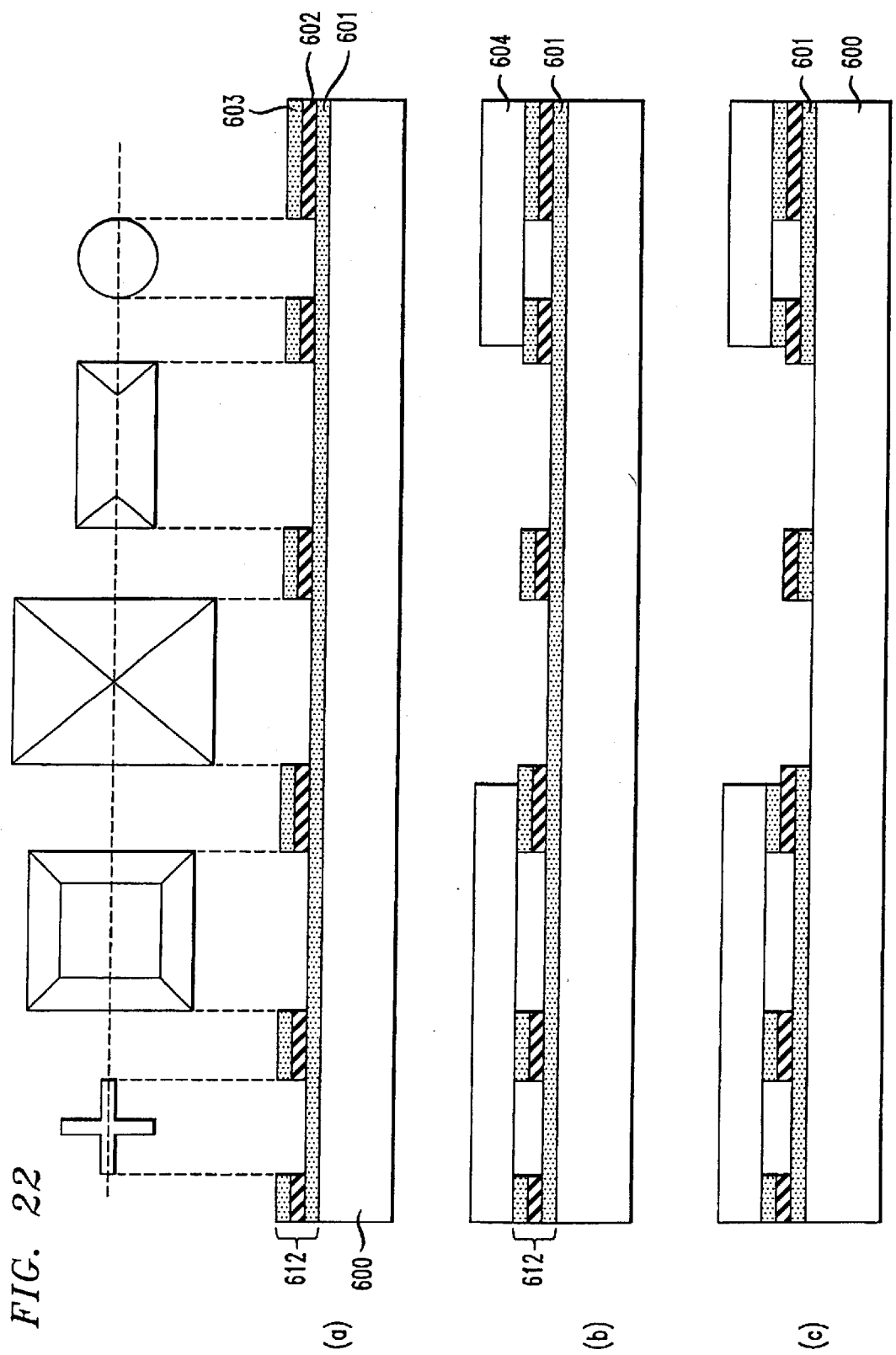
FIGS. 22(a)–(c) illustrates a silicon wafer coated with a three layer dielectric stack with a coating of photoresist over cavities c1, c2, and c5 in accordance with the present invention.
Figure 23:
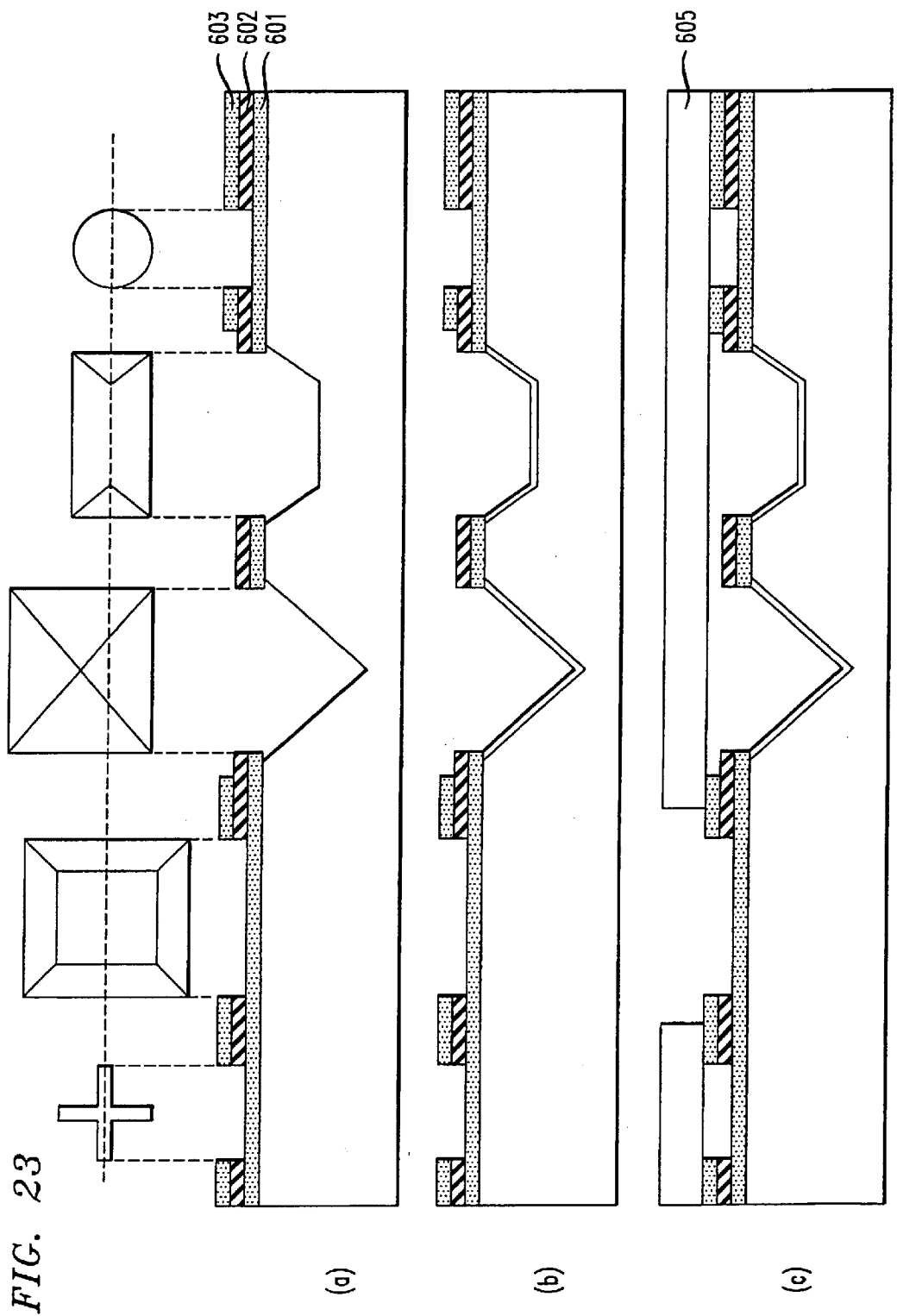
FIGS. 23(a)–(c) illustrates etching and passivating cavities c3 and c4, and adding photoresist over all but cavity area c2 in accordance with the present invention.
Figure 24:
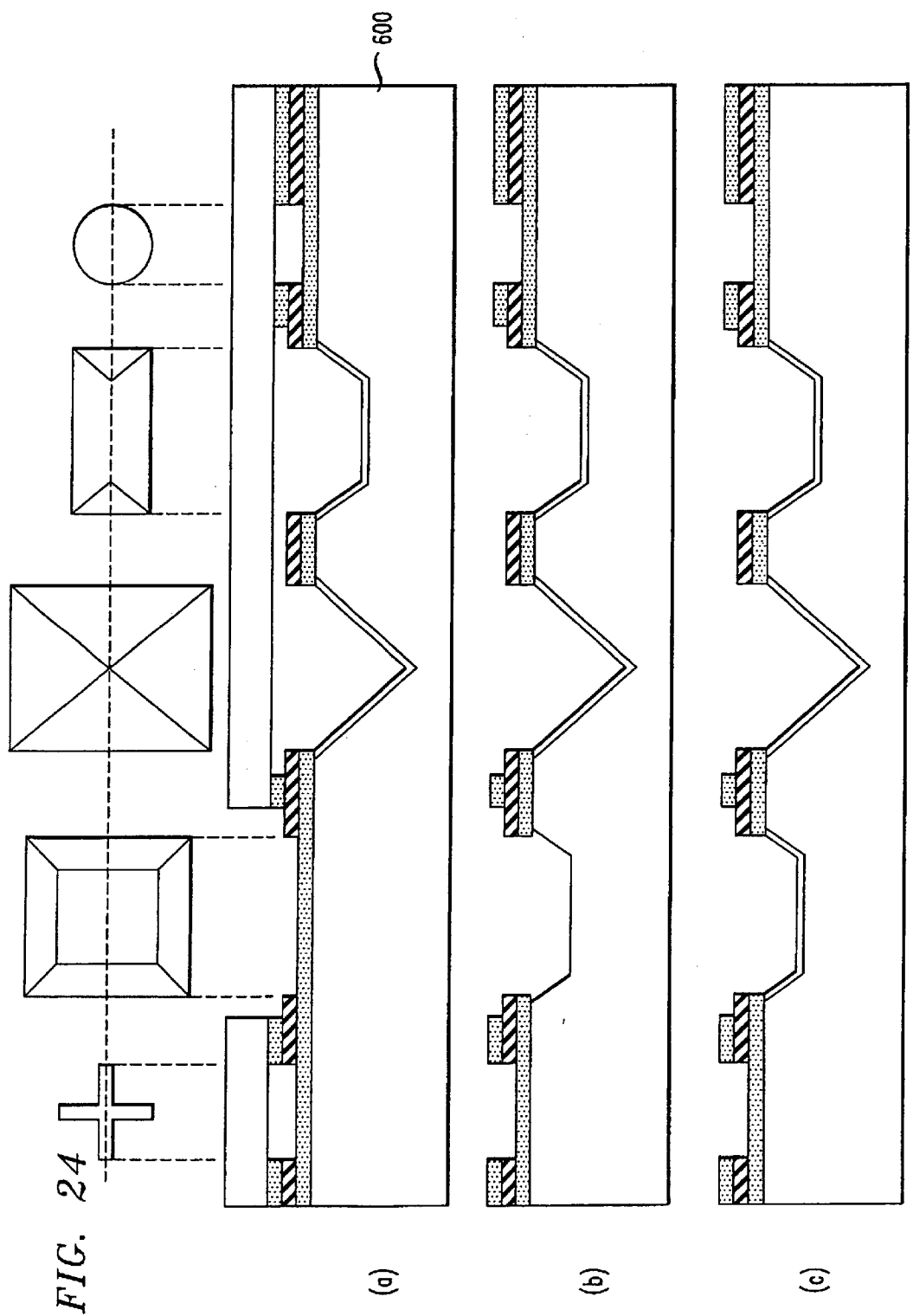
FIGS. 24(a)–(c) illustrates etching and passivating cavity c2 in accordance with the present invention.
Figure 25:
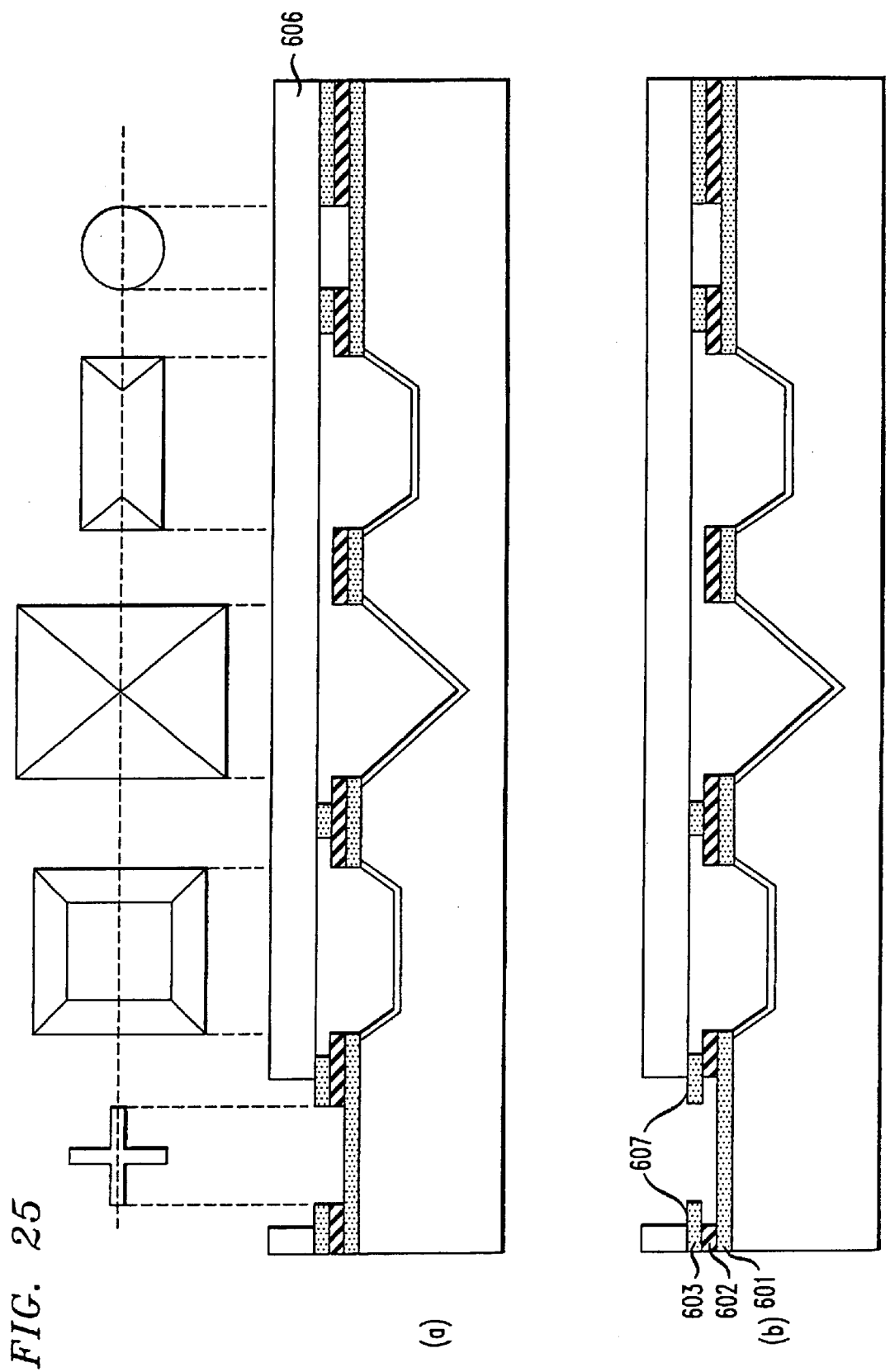
FIGS. 25(a)–(c) illustrates depositing a photoresist on all but cavity area c1, etching and passivating cavity c1, and deposition of metal in cavity c1 in accordance with the present invention.
Figure 25:
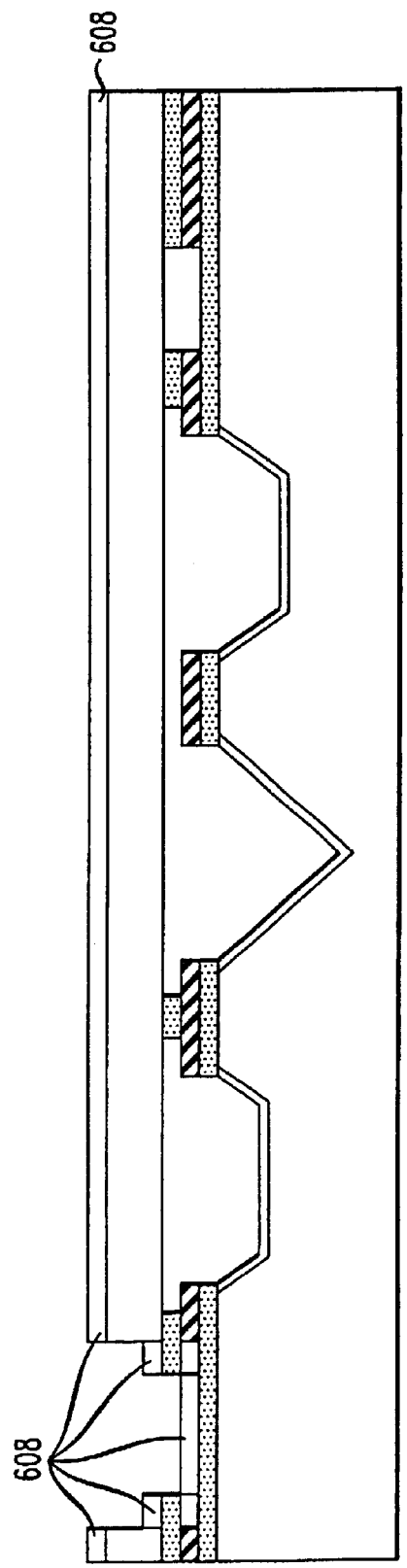
Figure 26:
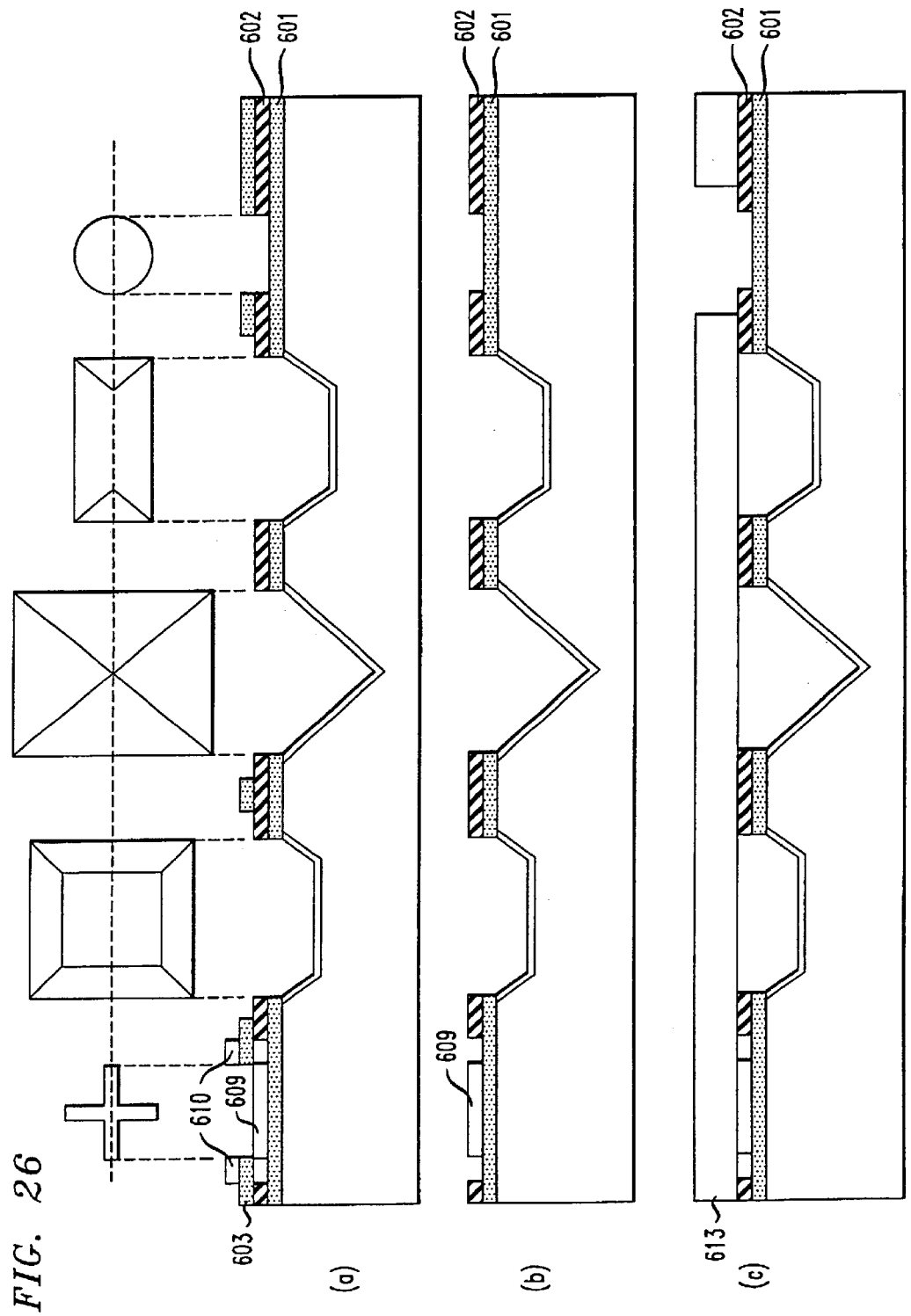
FIGS. 26(a)–(c) illustrates removing excess metal from cavity area c1 and depositing a photoresist over all cavity areas but cavity area c5 in accordance with the present invention.
Figure 27:
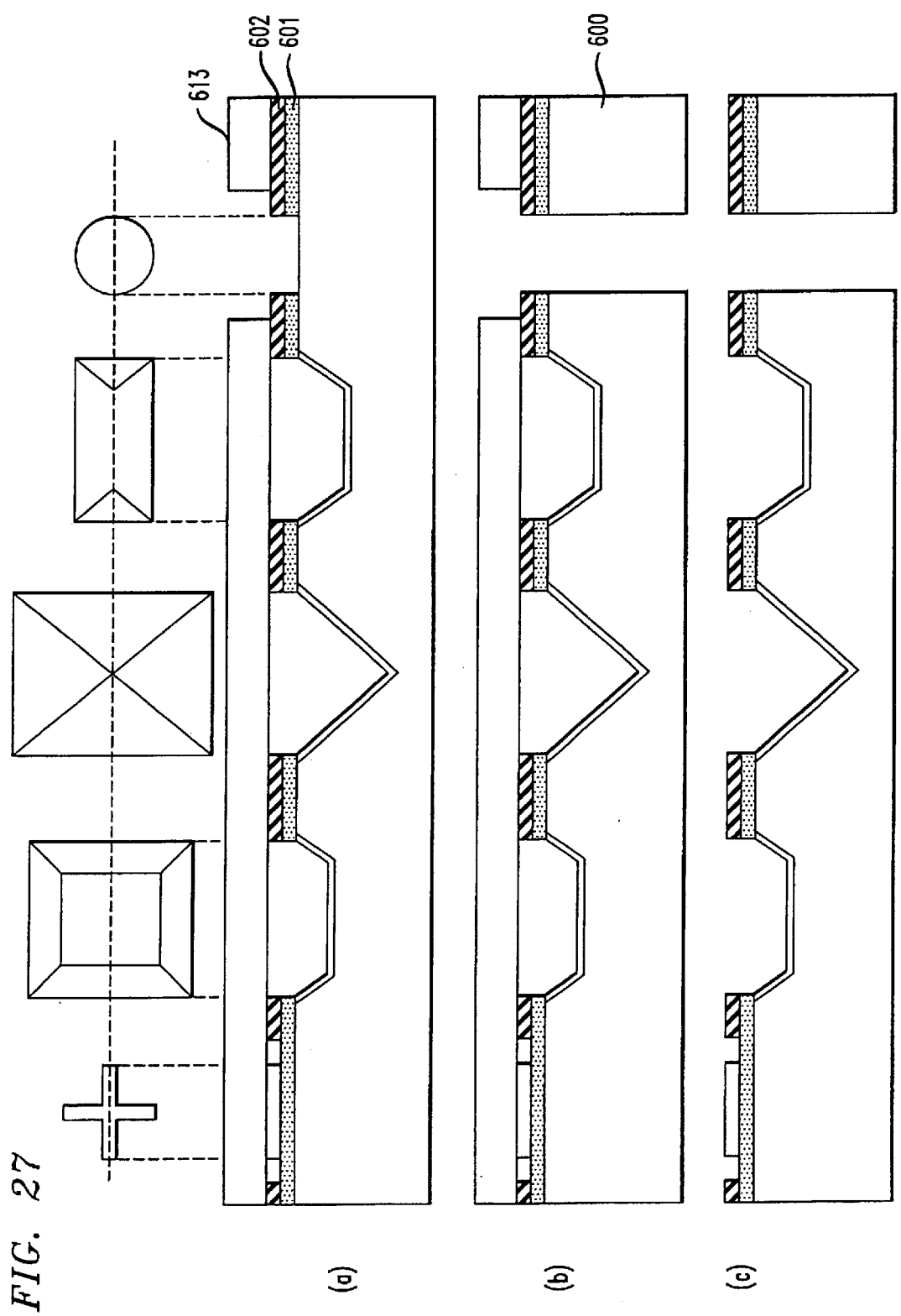
FIGS. 27(a)–(c) illustrates etching cavity c5 through the substrate and removing the photoresist.

In FIG. 19(b) the substrate 500 exposed in cavity area c1 is etched and then passivated. The lack of photoresist coverage in cavities c3 and c4 is not critical, since these cavities were already fixed by passivation and therefore are protected from the etch of cavity area c1. The same process steps are repeated for etching cavity area c2 and later cavity area c5 as illustrated in FIGS. 20 and 21, respectively.

In many cases the patterned substrate is meant to be populated with components, some of which are active and require a power feed. It is therefore expected that some micro-structures, e.g., an optical bench, will incorporate traces of metal. Metal can be used, for example, for power supply and for AC signals. In addition to their primary goal of conducting current to the active components, metal features can also serve as alignment patterns for part placement on an optical bench. Examples of metals conventionally used include Au, Cu, Pt, Ti, Cr, W, Sn, Pd, Pb, Ni, Mo, Al, and Co, or a combination thereof.

The fabrication of the metal traces is typically achieved by deposition of a metal film and patterning by lithography and etching. Lift-off is also a commonly used technique for forming the metal traces. As explained above, it is difficult to practice lithography over extreme topography. Thus, it would be desirable to fabricate the metal traces prior to the etching of the cavities. It is also preferred to fabricate the metal traces after the filler plugs of the cavity areas are in place.

When fabricating the metal traces, it should be noted that some chemicals used for etching the cavity areas may not be compatible with the metal traces. Also, some of the metal traces may need to be a few microns thick, in which case the surface can no longer be considered planar.

The fabrication of the metal traces can be incorporated into the methods of the invention utilizing the techniques described above. For example, referring to the first preferred embodiment described in conjunction with FIGS. 2(a)–7(c), the metal traces features can be added onto the zero level mask and etched into the hard mask 201. The cavity areas in the hard mask that define the metal traces are filled with metal. For example, a blanket deposition of the metal can be used or a lift-off process. The wafer is then planarized, e.g., by CMP, so that the metal over the hard mask 201 is removed, leaving metal plugs in the cavity area. The process sequence is basically identical to that used for the filler material, with the exception that the filler material is sacrificial, and the metal trace is kept. The process is not limited to a single type of metal trace, and different metals can be used in different trenches. Metal used in the trace that may be reactive with a chemical used for etching the cavities can be protected by depositing a thin isolation layer over the metal trench region. Alternatively, metal can be added to a cavity after it is etched as described above.

The process of the invention provides thin metal traces, having a thickness roughly equal to that of the hard mask 201. Following the etching of the cavities plating can be used to make thicker traces. Plating can be, for example, electroplating or electro-less plating. The thin trace can be used as a seed layer for the plating, thus metal is added only over existing traces.

EXAMPLE

This example describes a method of the invention to produce a micro-structure. The example merges several of the techniques described above and is shown in FIGS. 22(a) to 27(c).

In FIG. 22(a), a silicon wafer 600 is coated with a three layer dielectric stack 612 that includes 2000 Å silicon nitride 601 coated on silicon, followed by 5000 Å silicon dioxide 602, and a top coat of 1000 Å silicon nitride 603. As described above, the overlay error is minimized by patterning of all the cavity areas into the dielectric stack 612 in one lithography step. This image is transferred through the two top layers 603 and 602, stopping on the bottom silicon nitride layer 601, using reactive ion etching, for example, CF4, or chemical etching, for example, hot phosphoric acid or hydrofluoric acid.

In FIG. 22(b) the pattern is then overcoated with a thick liquid photoresist or dry film resist 604. Depending on dielectric stack 612 thickness, it might not be necessary to use a thick photoresist for this first lithography layer only. The photoresist 604 is patterned with a mask which roughly aligns to and exposes the nitride layer 601 of c3 and c4 in such a way as to protect cavity areas c1, c2 and c5. A reactive ion etch step is then used to open the nitride 601, exposing the bulk silicon 600 as shown in FIG. 22(c).

In FIG. 23(a) the micro-structure is immersed in an anisotropic etchant such as ethylene diamene, pyrocatecol, or water, which will selectively etch the silicon at cavity areas c3 and c4 without etching the silicon dioxide 602 or silicon nitride 601 and 603, stopping on stable <111> planes. The wafer is then oxidized to protect the etched cavities as shown in FIG. 23(b).

Similarly, c2 is then patterned, this time requiring either a thick photoresist or dry film photoresist 605 in the presence of the extreme topography as shown in FIG. 23(c). Cavity area c2 is then etched to expose the bulk silicon 600 in FIG. 24(a). Cavity area c2 is then etched as shown in FIG. 24(b) and passivated as shown in FIG. 24(c). Since c2 has a <100> plane at the base of the cavity, it requires a timed etch to achieve the proper depth.

In this example, the next step is depositing a metal pattern at cavity area c1. Again, as shown in FIG. 25(a), a thick or dry film photoresist 606 is applied and pattern imaged to produce a crude opening over the cavity areas, with the exception of cavity area c1. In FIG. 25(b) a chemical etch of hydrofluoric acid is used to undercut the silicon dioxide 602 between the two nitride layers 601 and 603 leaving an overhang 607 above the top nitride layer 601. In FIG. 25(c) a directional deposition technique, such as evaporation, is used to deposit a metal trace 608, for example, 4000 Å of gold. The bulk of the excess gold is then lifted off in a chemical photoresist stripper which removes the photoresist 606 as shown in FIG. 26(a). This will leave the metal trace within the cavity area c1 609, as well as a rim of metal 610 where the thick photoresist overlapped beyond the original opening produced during the zero patterning, as shown in FIG. 26(a). This remaining rim of metal 610 is lifted off again in a short hot phosphoric acid etch, which will undercut the silicon nitride 603 from under the rim of gold 610, leaving the trace of gold within cavity area c1 609 as shown in FIG. 26(b).

In the final step to produce a cavity in c5, a thick or dry film photoresist 613 is applied and opened to define a crudely aligned image over c5 as shown in FIG. 26(c). In FIG. 27(a), the photoresist 613 is used to etch the nitride 601, using the original silicon dioxide 602 opening to achieve optimal registration and dimensional control. A deep reactive ion etch technique is then used to transfer the pattern through the silicon 600 in FIG. 27(b). The resulting structure is shown in FIG. 27(c).

What is claimed is:

1. A micro-structure formed in accordance with a process comprising the steps of:
    patterning a substrate using a single mask to identify two or more cavity areas to be etched in different etching steps; and
    selectively choosing a cavity area for etching;
    wherein at least one of the cavity areas remains substantially unchanged during a given one of the etching steps.

2. A micro-structure formed in accordance with a process comprising the steps of:
    patterning a substrate to identify two or more cavity areas to be etched;
    filling at least one of said cavity areas with a distinctive filler material;
    selectively choosing to be etched at least one cavity area containing a distinctive filler material, said choosing based at least in part on said distinctive filler material; and
    etching said chosen cavity area to form an etched cavity.

3. The micro-structure of claim 2 wherein selectively choosing at least one cavity area to be etched comprises selectively removing said distinctive filler material.

4. The micro-structure of claim 2 wherein said filling at least one cavity area with a distinctive filler material comprises:
    (a) filling a plurality of cavity areas with a first filler material;
    (b) protecting at least the cavity areas containing first filler material with a protective material, leaving first filler material of at least one cavity area unprotected;
    (c) removing said unprotected first filler material to form at least one exposed cavity area;
    (d) removing the protective material; and
    (e) adding a distinctive filler material to said at least one exposed cavity area.

5. The micro-structure of claim 4 wherein steps (b) through (e) are repeated N−1 times, wherein N equals the number of cavity etching steps.

6. The micro-structure of claim 2 further comprising passivating said etched cavity.

7. The micro-structure of claim 2 wherein said filling a cavity area with a distinctive filler material comprises filling said plurality of cavity areas to be etched with one of two filler materials in an alternating sequence.

8. The micro-structure of claim 7 wherein said filling said pluarality of cavity areas to be etched with one of two filler materials in an alternating sequence comprises:
    (a) filling with a first filler material said plurality of cavity areas to be etched in an etching sequence;
    (b) protecting with a protecting material at least one unprotected cavity area and any previously protected cavity areas, said protecting performed in a sequence opposite the etching sequence;
    (c) removing the first filler material from remaining unprotected cavity areas;
    (d) removing said protecting material deposited in step (b);
    (e) filling with a second filler material said plurality of cavity areas to be etched in an etching sequence;
    (f) protecting with a protecting material at least one unprotected cavity area and any previously protected cavity areas, said protecting performed in a sequence opposite the etching sequence;

(g) removing the second filler material from remaining unprotected cavity areas;
(h) removing said protecting material deposited in step (f); and
(i) repeating steps (a) through (h) for all but the first cavity area to be etched in the etching sequence, such that the substrate within said first cavity area to be etched is exposed by removing said first filler material in step (c) or removing said second filler material in step (g).

9. The micro-structure of claim 2 further comprising patterning additional cavity areas and depositing metal in said additional cavity areas.

* * * * *